:::

(12) United States Patent
Misaki

(10) Patent No.: US 12,353,104 B2
(45) Date of Patent: Jul. 8, 2025

(54) ACTIVE MATRIX SUBSTRATE, LIQUID CRYSTAL DISPLAY DEVICE INCLUDING THE SAME, AND METHOD OF MANUFACTURING ACTIVE MATRIX SUBSTRATE

(71) Applicant: Sharp Display Technology Corporation, Kameyama (JP)

(72) Inventor: Katsunori Misaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/588,211

(22) Filed: Feb. 27, 2024

(65) Prior Publication Data

US 2024/0353719 A1    Oct. 24, 2024

(30) Foreign Application Priority Data

Apr. 19, 2023   (JP) .................................. 2023-068674

(51) Int. Cl.
| | |
|---|---|
| *G02F 1/1362* | (2006.01) |
| *G02F 1/1343* | (2006.01) |
| *H10D 86/01* | (2025.01) |
| *G02F 1/1337* | (2006.01) |
| *G02F 1/1368* | (2006.01) |

(52) U.S. Cl.
CPC .. *G02F 1/136222* (2021.01); *G02F 1/134372* (2021.01); *H10D 86/021* (2025.01); *G02F 1/133707* (2013.01); *G02F 1/136218* (2021.01); *G02F 1/1368* (2013.01); *G02F 2201/38* (2013.01)

(58) Field of Classification Search
CPC ......... G02F 1/136222; G02F 1/136218; G02F 1/134372; G02F 1/133707; G02F 2201/38
See application file for complete search history.

(56) References Cited

U.S. PATENT DOCUMENTS

| | | | |
|---|---|---|---|
| 2017/0176823 A1* | 6/2017 | Akiyoshi | .......... G02F 1/134363 |
| 2019/0043895 A1* | 2/2019 | Shen | ................ G02F 1/13394 |

FOREIGN PATENT DOCUMENTS

JP       2017-116821 A      6/2017

* cited by examiner

*Primary Examiner* — Paisley L Wilson
(74) *Attorney, Agent, or Firm* — ScienBiziP, P.C.

(57) ABSTRACT

An active matrix substrate includes: a base substrate; a plurality of thin film transistors provided on the base substrate corresponding to a plurality of subpixels; color filters provided on the plurality of thin film transistors, respectively, and including colored layers of predetermined colors corresponding to the plurality of subpixels, respectively; a first transparent electrode provided above the color filters; a second transparent electrode provided on the first transparent electrode with an inorganic protection film interposed therebetween, the second transparent electrode including a slit having a belt shape; and an antireflection layer provided in a belt shape on the inorganic protection film in a boundary portion between the colored layers of different colors among the predetermined colors and including a first metal layer, an intermediate layer, and a second metal layer layered in order. The antireflection layer is provided with a cut-away portion not overlapping an end portion of the slit.

6 Claims, 25 Drawing Sheets

ACTIVE MATRIX SUBSTRATE, LIQUID CRYSTAL DISPLAY DEVICE INCLUDING THE SAME, AND METHOD OF MANUFACTURING ACTIVE MATRIX SUBSTRATE

CROSS-REFERENCE TO RELATED APPLICATIONS

This application claims the benefit of priority to Japanese Patent Application Number 2023-068674 filed on Apr. 19, 2023. The entire contents of the above-identified application are hereby incorporated by reference.

BACKGROUND

Technical Field

The disclosure relates to an active matrix substrate, a liquid crystal display device including the active matrix substrate, and a method of manufacturing the active matrix substrate.

In recent years, a color filter-on-array (hereinafter also referred to as COA) structure is often used in liquid crystal display devices, in which color filters are provided on an active matrix substrate (array substrate) and alignment with a counter substrate is not required.

For example, JP 2017-116821 A discloses a liquid crystal display device in which pixel electrodes and a common electrode are provided on a substrate having a COA structure and which uses a fringe field switching (FFS) mode, which is one transverse electrical field driving method.

SUMMARY

In a liquid crystal display device of a transverse electrical field driving method including an active matrix substrate having a COA structure in which a slit for liquid crystal alignment is formed in a pixel electrode or a common electrode, for example, when the pixel size is an ultra-high definition pixel size from 1000 pixel per inch (ppi) to 1200 ppi or more for use in a head-mounted display or the like, an end portion of the slit formed in a transparent electrode of the pixel electrode or the common electrode often overlaps an antireflection layer including a metal layer disposed between colored layers of color filters. In this case, in a portion where the antireflection layer that is electrically floating and the end portion of the slit overlap each other, alignment disorder of a liquid crystal layer occurs, and thus image sticking or an afterimage occurs, and thus display quality is deteriorated.

The disclosure has been made in view of the above, and an object of the disclosure is to suppress the occurrence of the image sticking or the afterimage at the end portion of the slit formed in the transparent electrode.

In order to achieve the above object, an active matrix substrate according to the disclosure includes a base substrate, a plurality of thin film transistors provided on the base substrate corresponding to a plurality of subpixels, color filters provided on the plurality of thin film transistors, respectively, and including colored layers of predetermined colors corresponding to the plurality of subpixels, respectively, a first transparent electrode provided above the color filters, a second transparent electrode provided on the first transparent electrode with an inorganic protection film interposed between the first transparent electrode and the second transparent electrode, the inorganic protection film being made of an inorganic insulating film, the second transparent electrode including a slit having a belt shape, and an antireflection layer provided in a belt shape on the inorganic protection film in a boundary portion between the colored layers of different colors among the predetermined colors and including a first metal layer, an intermediate layer, and a second metal layer layered in order, in which the antireflection layer is provided with a cut-away portion not overlapping an end portion of the slit.

A liquid crystal display device according to the disclosure includes the above-described active matrix substrate, a counter substrate provided to face the active matrix substrate, and a liquid crystal layer provided between the active matrix substrate and the counter substrate.

A method of manufacturing an active matrix substrate according to the disclosure includes forming a plurality of thin film transistors corresponding to a plurality of subpixels on a base substrate, forming color filters including colored layers of predetermined colors corresponding to the plurality of subpixels, respectively, the colored layers disposed on the plurality of thin film transistors, respectively, forming a first transparent electrode by forming a first transparent conductive film above the color filters and then patterning the first transparent conductive film, forming an antireflection forming layer including a first metal layer, an intermediate layer, and a second metal layer layered in order in a belt shape, the antireflection forming layer overlapping a boundary portion between the colored layers of different colors among the predetermined colors by forming an inorganic insulating film, the first metal film, the intermediate film, and the second metal film, all of which cover the first transparent electrode, and then patterning the first metal film, the intermediate film, and the second metal film to form the first metal layer, the intermediate layer, and the second metal layer, respectively, forming an inorganic protection film by patterning the inorganic insulating film exposed from the antireflection forming layer, and forming a second transparent electrode including a slit having a belt shape and including an end portion overlapping the antireflection forming layer by forming a second transparent conductive film to cover the antireflection forming layer on the inorganic protection film and then patterning the second transparent conductive film, in which in the second transparent electrode, the antireflection forming layer exposed from the slit is removed and an antireflection layer including a cut-away portion is formed.

According to the disclosure, the occurrence of image sticking or an afterimage at the end portion of the slit formed in the transparent electrode can be suppressed.

BRIEF DESCRIPTION OF DRAWINGS

The disclosure will be described with reference to the accompanying drawings, wherein like numbers reference like elements.

DESCRIPTION OF EMBODIMENTS

Embodiments of the disclosure will be described below in detail with reference to the drawings. Note that the disclosure is not limited to the embodiments to be described below.

First Embodiment

Figure 1:
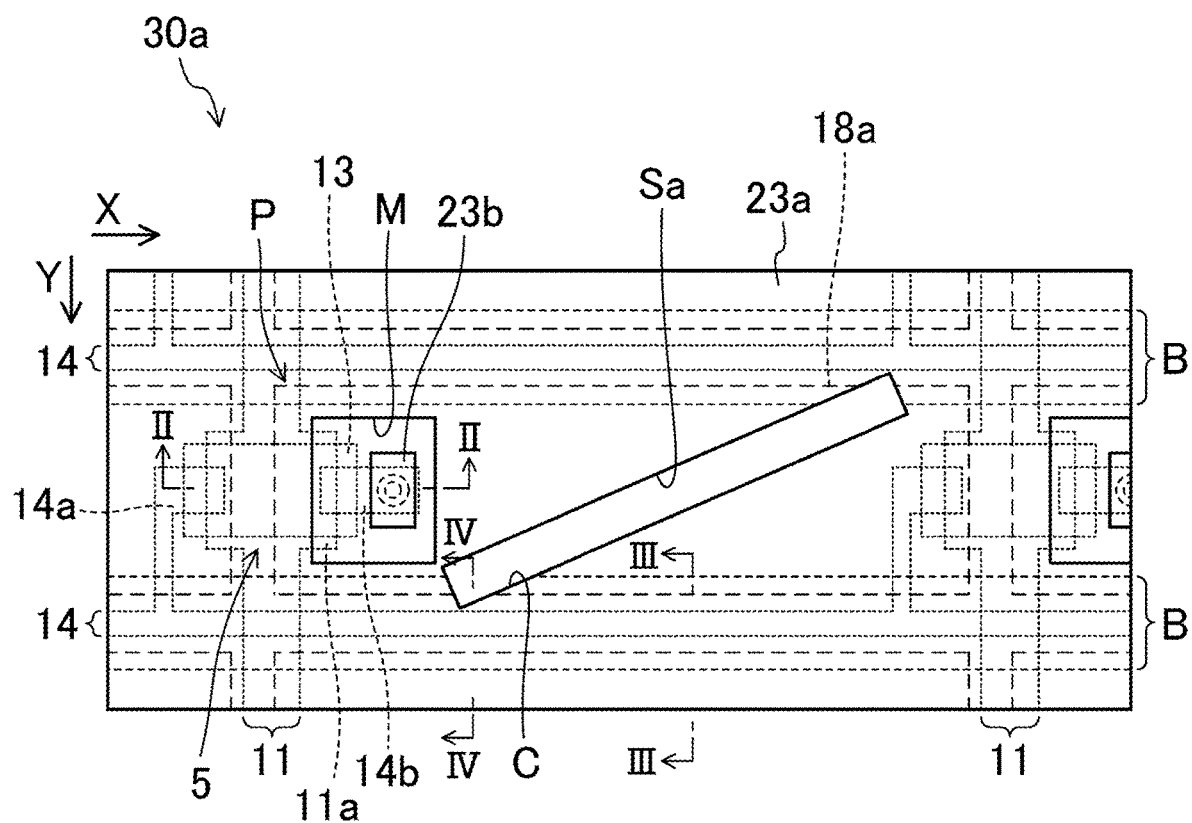
FIG. 1 is a plan view of an active matrix substrate that is a component of a liquid crystal display device according to a first embodiment of the disclosure.
Figure 2:
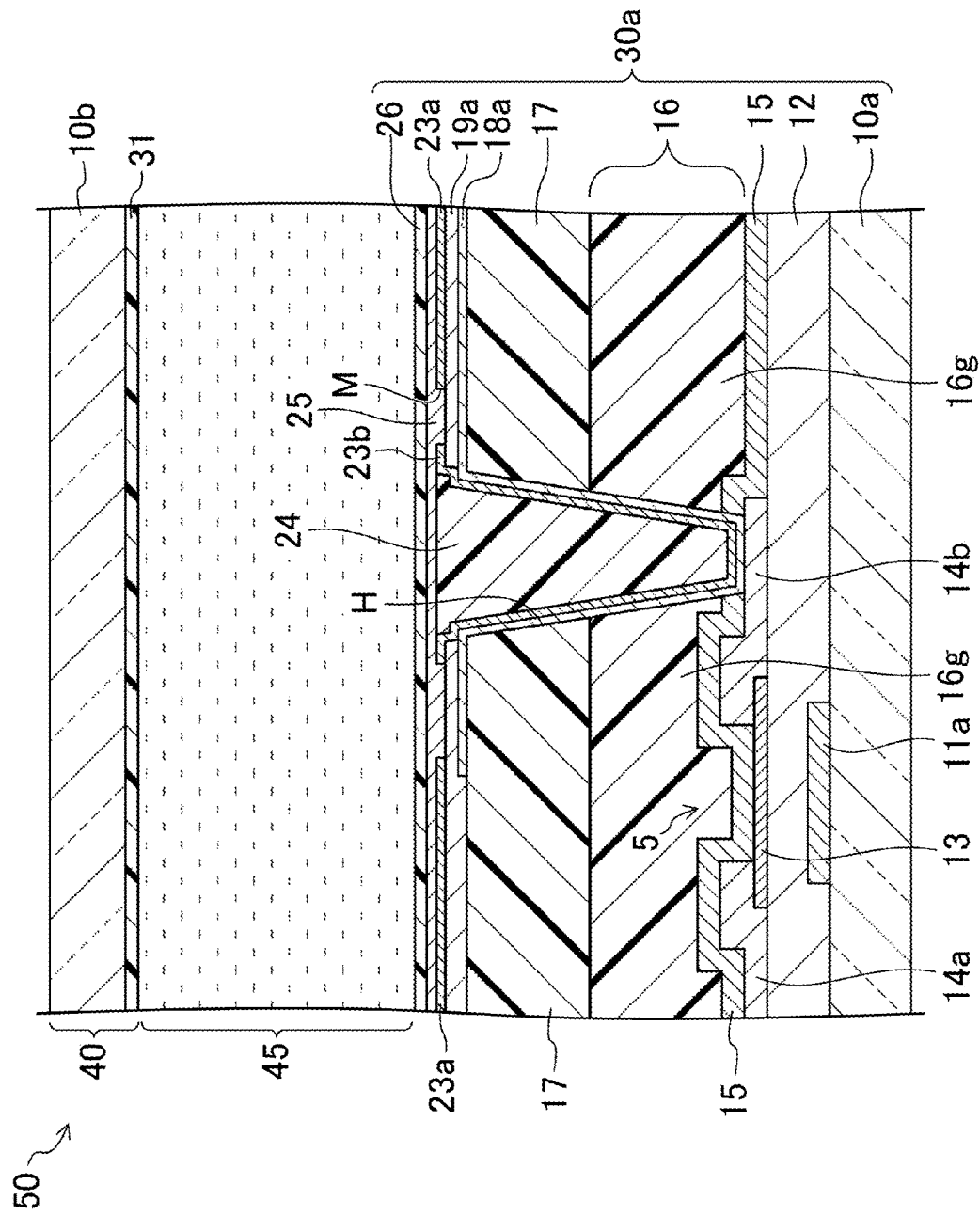
FIG. 2 is a cross-sectional view of the active matrix substrate and the liquid crystal display device including the active matrix substrate taken along line II-II in FIG. 1.
Figure 3:
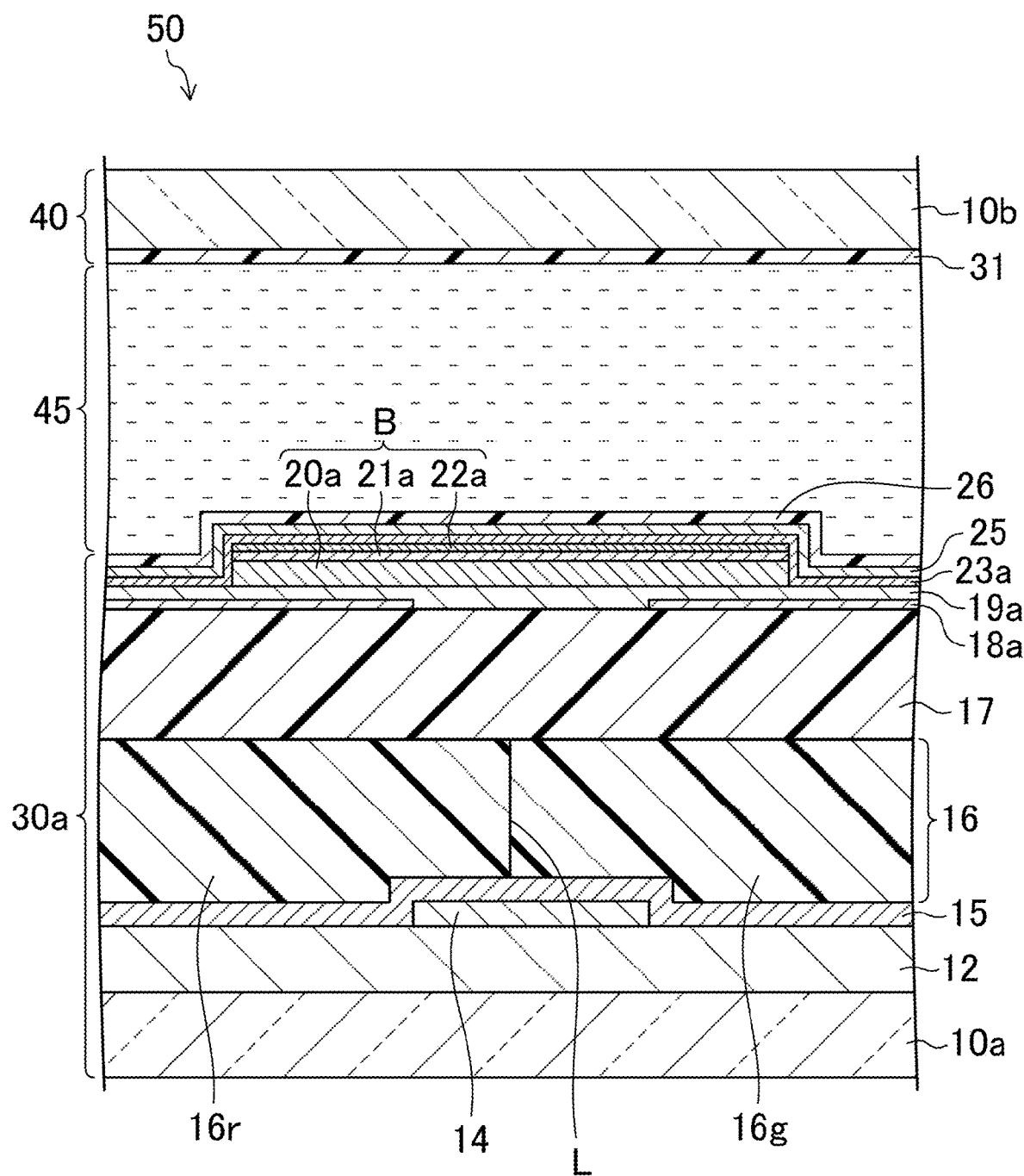
FIG. 3 is a cross-sectional view of the active matrix substrate and the liquid crystal display device including the active matrix substrate taken along line III-III in FIG. 1.
Figure 4:
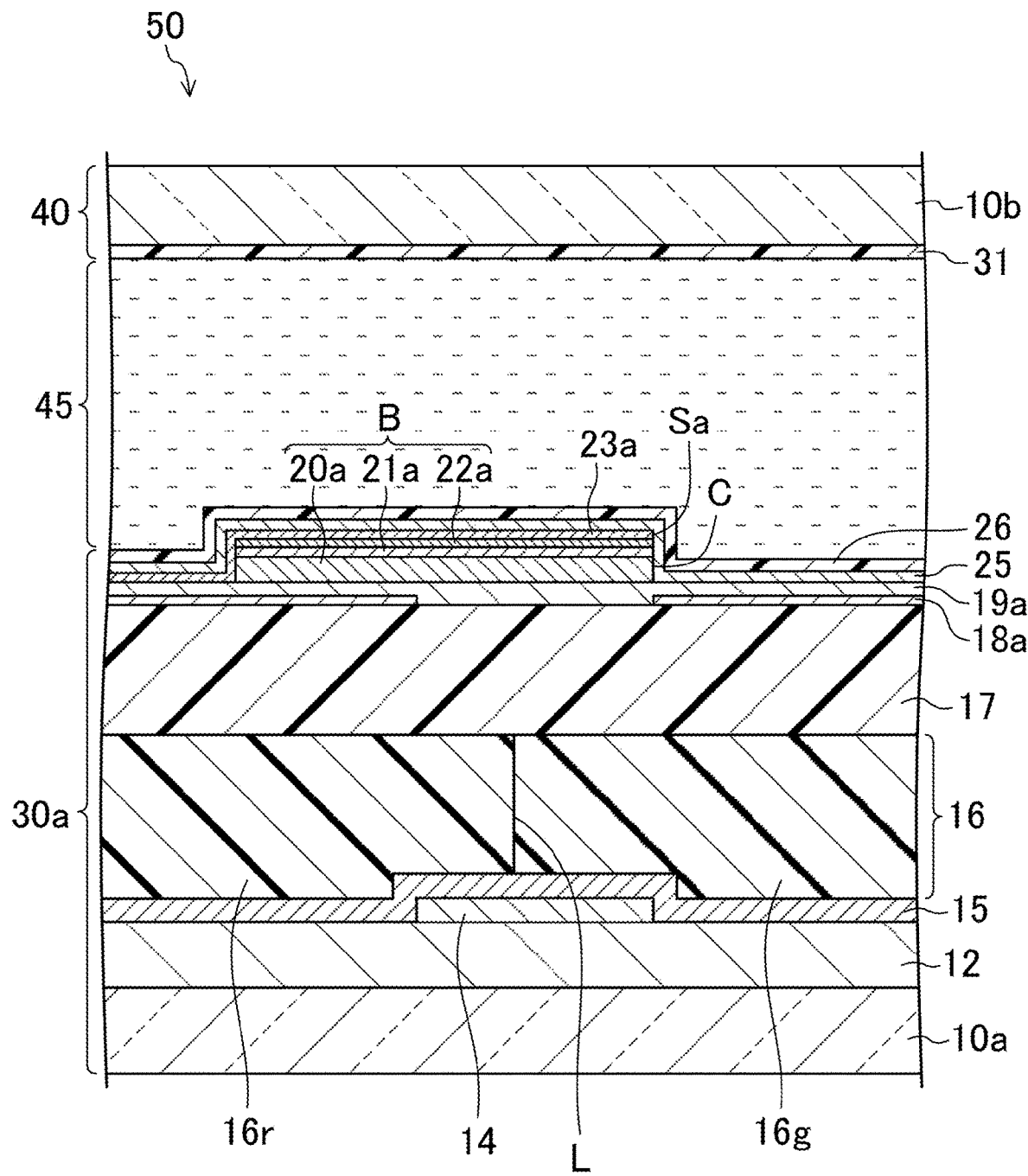
FIG. 4 is a cross-sectional view of the active matrix substrate and the liquid crystal display device including the active matrix substrate taken along line IV-IV in FIG. 1.

FIGS. 1 to 14 illustrate a first embodiment of an active matrix substrate, a liquid crystal display device including the active matrix substrate, and a method of manufacturing the active matrix substrate, according to the disclosure. FIG. 1 is a plan view of an active matrix substrate 30*a* that is a component of the liquid crystal display device according to the present embodiment. FIGS. 2, 3, and 4 are cross-sectional views of a liquid crystal display device 50 taken along lines II-II, III-III, and IV-IV, respectively, in FIG. 1.

As illustrated in FIGS. 2 to 4, the liquid crystal display device 50 includes the active matrix substrate 30*a* having a COA structure, a counter substrate 40 provided to face the active matrix substrate 30*a*, and a liquid crystal layer 45 provided between the active matrix substrate 30*a* and the counter substrate 40. In the liquid crystal display device 50, a plurality of subpixels P (see FIG. 1) are provided in a matrix shape in a display region performing image display. In the display region, as illustrated in FIGS. 2 to 4, subpixels P for gray scale display of red with red layers 16*r*, subpixels P for gray scale display of green with green layers 16*g*, and subpixels P for gray scale display of blue with blue layers (not illustrated) are provided so as to be adjacent to one another. Note that in the display region, one pixel is constituted by three adjacent subpixels P for gray scale display of red, green, and blue.

As illustrated in FIGS. 2 to 4, the active matrix substrate 30*a* includes a base substrate 10*a* such as a glass substrate, a plurality of thin film transistors (hereinafter also referred to as TFTs) 5 provided on the base substrate 10*a* corresponding to the plurality of subpixels P, color filters 16 provided on the TFTs 5, respectively, an organic protection film 17 provided on the color filters 16, a plurality of pixel electrodes 18a provided, as first transparent electrodes, on the organic protection film 17, an inorganic protection film 19a provided on the pixel electrodes 18a, a common electrode 23a provided, as a second transparent electrode, on the inorganic protection film 19a, a surface protection film 25 provided on the common electrode 23a, and an alignment film 26 provided on the surface protection film 25. As illustrated in FIG. 1, the active matrix substrate 30a includes, on the base substrate 10a in the display region, a plurality of gate lines 11 extending parallel to each other in the Y direction in the drawing, and a plurality of source lines 14 extending parallel to each other in the X direction in the drawing so as to intersect the gate lines 11 with a gate insulating film 12 interposed therebetween.

As illustrated in FIG. 2, the TFT 5 includes a gate electrode 11a provided on the base substrate 10a, the gate insulating film 12 provided to cover the gate electrode 11a, a semiconductor layer 13 provided in an island shape on the gate insulating film 12 so as to overlap the gate electrode 11a, and a source electrode 14a and a drain electrode 14b provided on the semiconductor layer 13 so as to be separated from each other. The TFT 5 is provided for each of intersections of the gate lines 11 and the source lines 14, that is, for each subpixel P. The gate electrode 11a is a wide portion of the gate line 11, as illustrated in FIG. 1. The semiconductor layer 13 includes, for example, an intrinsic amorphous silicon layer provided on the gate insulating film 12 side, and a pair of $n^+$ amorphous silicon layers provided on the intrinsic amorphous silicon layer and disposed so that a channel region of the intrinsic amorphous silicon layer is exposed and separated from each other. As illustrated in FIG. 1, the source electrode 14a is an L-shaped protrusion on the side of the source line 14 and is provided so as to be in contact with one of the pair of $n^+$ amorphous silicon layers of the semiconductor layer 13. The drain electrode 14b is provided so as to be in contact with the other of the pair of $n^+$ amorphous silicon layers of the semiconductor layer 13, and is electrically connected to the pixel electrode 18a via a contact hole H formed in the color filter 16 and the organic protection film 17, as illustrated in FIG. 2. Although the semiconductor layer 13 including the intrinsic amorphous silicon layer is exemplified in the present embodiment, the semiconductor layer 13 may be made of, for example, low temperature polysilicon (LTPS), an In—Ga—Zn—O-based oxide semiconductor, or the like.

The color filters 16 are provided so that colored layers of predetermined colors are disposed corresponding to the subpixels P, respectively, and specifically, the color filters 16 include the red layer 16r provided as a colored layer in the subpixel P for gray scale display of red, the green layer 16g provided as a colored layer in the subpixel P for gray scale display of green, and the blue layer (not illustrated) provided as a colored layer in the subpixel P for gray scale display of blue, as illustrated in FIGS. 2 to 4. An interlayer insulating film 15 is provided between the TFT 5 and the color filter 16. Note that the gate insulating film 12, the interlayer insulating film 15, the inorganic protection film 19a, and the surface protection film 25 are each constituted by a single-layer or a multi-layer of inorganic insulating films made of, for example, silicon nitride, silicon oxide, or silicon oxynitride.

The organic protection film 17 is made of, for example, a transparent organic resin material such as an acrylic resin.

As illustrated in FIGS. 1 to 4, the pixel electrode 18a is provided in a rectangular shape on the organic protection film 17. As illustrated in FIG. 1, a plurality of the pixel electrodes 18a are provided in a matrix shape corresponding to the plurality of subpixels P, respectively. The pixel electrode 18a constitutes an auxiliary capacity of each subpixel P together with the common electrode 23a and the inorganic protection film 19a provided between the pixel electrode 18a and the common electrode 23a.

As illustrated in FIG. 1, the common electrode 23a is provided in common to the plurality of subpixels P. As illustrated in FIGS. 1 and 4, a slit Sa for aligning the liquid crystal layer 45 is provided in a belt shape on the common electrode 23a so as to penetrates the common electrode 23a. Here, as illustrated in FIG. 1, both end portions of the slit Sa are provided so as to intersect an antireflection forming layer Bp which will be described later. As illustrated in FIGS. 1 and 2, an opening M is provided in a rectangular shape in the common electrode 23a so as to overlap the contact hole H so that the opening M penetrates the common electrode 23a. As illustrated in FIGS. 1 and 2, inside the opening M of the common electrode 23a, a transparent conductive layer 23b formed in the same layer with the same material as the common electrode 23a is provided in a recessed shape separated from the common electrode 23a so as to overlap a bottom face and a side surface of the contact hole H. As illustrated in FIG. 2, a resin-filled layer 24 is provided between the transparent conductive layer 23b and the surface protection film 25. As illustrated in FIGS. 1, 3, and 4, between the common electrode 23a and the inorganic protection film 19a, on the inorganic protection film 19a, an antireflection layer B is provided at a boundary portion L between the colored layers of different colors so as to overlap the boundary portion L.

As illustrated in FIG. 1, the antireflection layers B are provided in a belt shape over the display region so as to overlap the source lines 14, respectively. As illustrated in FIGS. 3 and 4, the antireflection layer B includes a first metal layer 20a, an intermediate layer 21a, and a second metal layer 22a layered in order on the inorganic protection film 19a, and is configured to suppress reflection of light incident from the liquid crystal layer 45 side by reflecting light incident from the liquid crystal layer 45 side by the second metal layer 22a, reflecting light transmitted through the second metal layer 22a without being reflected by the second metal layer 22a by the first metal layer 20a, and causing light reflected by the second metal layer 22a and light reflected by the first metal layer 20a to cancel each other. Here, the first metal layer 20a is made of, for example, a metal film such as a tungsten film, a molybdenum film, or a molybdenum-tungsten alloy film with a thickness of approximately 60 nm or greater. The intermediate layer 21a is made of, for example, an inorganic insulating film such as a silicon nitride film or a transparent conductive film such as an indium tin oxide (ITO) film or an indium zinc oxide (IZO) film with a refractive index of approximately from 1.8 to 2.1 and a thickness of approximately from 40 nm to 90 nm. The second metal layer 22a is made of, for example, a metal film such as a tungsten film or a molybdenum film with a thickness of approximately from 2 nm to 15 nm.

As illustrated in FIGS. 1 and 4, the antireflection layer B is provided with a cut-away portion C so as not to overlap both the end portions of the slit Sa. Here, an end face of the cut-away portion C and an end face of an end portion of the slit Sa corresponding to the cut-away portion C are provided to be flush with each other. In the present specification, the end faces being flush with each other includes not only a case where the two end faces are exactly aligned with each other without a step but also a case where there is a slight step within approximately 0.8 μm, for example.

The alignment film 26 and an alignment film 31, which will be described later, are made of, for example, a polyimide resin having a rubbed surface.

As illustrated in FIGS. 2 to 4, the counter substrate 40 includes a base substrate 10b such as a glass substrate, and the alignment film 31 provided on the base substrate 10b.

The liquid crystal layer 45 is made of, for example, a nematic liquid crystal material having electro-optical properties. The liquid crystal layer 45 is sealed between the active matrix substrate 30a and the counter substrate 40 by a sealing member having a frame-like shape that bonds the active matrix substrate 30a and the counter substrate 40 in a frame region around the display region.

In the liquid crystal display device 50 having the above-described configuration, a predetermined voltage is applied to the liquid crystal layer 45 disposed between each pixel electrode 18a and the common electrode 23a and the auxiliary capacity, and the alignment state of the liquid crystal layer 45 is changed by an electrical field generated in a direction along the surface of the substrate, that is, in a transverse direction, thereby adjusting the transmittance of light passing through the panel of each subpixel P to display images.

Next, a method of manufacturing the liquid crystal display device 50 according to the present embodiment will be described, focusing on a method of manufacturing the active matrix substrate 30a. FIGS. 5 to 14 are first to tenth cross-sectional views, respectively, sequentially illustrating a part of a manufacturing step of the active matrix substrate 30a. In each of the cross-sectional views of FIGS. 5 to 14, a right side portion, a center portion, and a left side portion in the drawing across a break line indicate portions corresponding to the cross-sectional views of FIGS. 2, 3, and 4, respectively. The manufacturing step of the active matrix substrate 30a includes a TFT forming step, a color filter forming step, a first transparent electrode forming step, an antireflection forming layer forming step, an inorganic protection film forming step, and a second transparent electrode forming step.

First, an aluminum film (thickness of approximately 300 nm) and a molybdenum niobium film (thickness of approximately 50 nm) are formed in order on the base substrate 10a such as a glass substrate by, for example, sputtering to form a metal layered film, and then the metal layered film is subjected to photolithography, etching, and resist stripping and cleaning, thereby forming the gate lines 11 including the gate electrodes 11a.

Subsequently, an inorganic insulating film (thickness of approximately 350 nm) such as a silicon nitride film or a silicon oxide film, an intrinsic amorphous silicon film (thickness of approximately 120 nm), and a phosphorus-doped n$^+$ amorphous silicon film (thickness of approximately 30 nm) are formed in order on the surface of the substrate on which the gate lines 11 are formed, by, for example, plasma chemical vapor deposition (CVD), and then the layered film of the intrinsic amorphous silicon film and the n$^+$ amorphous silicon film is subjected to photolithography, etching, and resist stripping and cleaning, thereby forming the gate insulating film 12 and a semiconductor forming layer.

Thereafter, a titanium film (thickness of approximately 30 nm), an aluminum film (thickness of approximately 300 nm), and a titanium film (thickness of approximately 50 nm) are formed in order on the surface of the substrate on which the gate insulating film 12 and the semiconductor forming layer are formed, by, for example, sputtering to form a metal layered film, and then the metal layered film is subjected to photolithography, etching, and resist stripping and cleaning, thereby forming the source lines 14, the source electrodes 14a, and the drain electrodes 14b.

Further, the n$^+$ amorphous silicon film of the semiconductor forming layer is removed by etching using the source electrodes 14a and the drain electrodes 14b as masks, thereby forming the semiconductor layers 13 and the TFTs 5 including the semiconductor layers 13 (TFT forming step).

Figure 5:
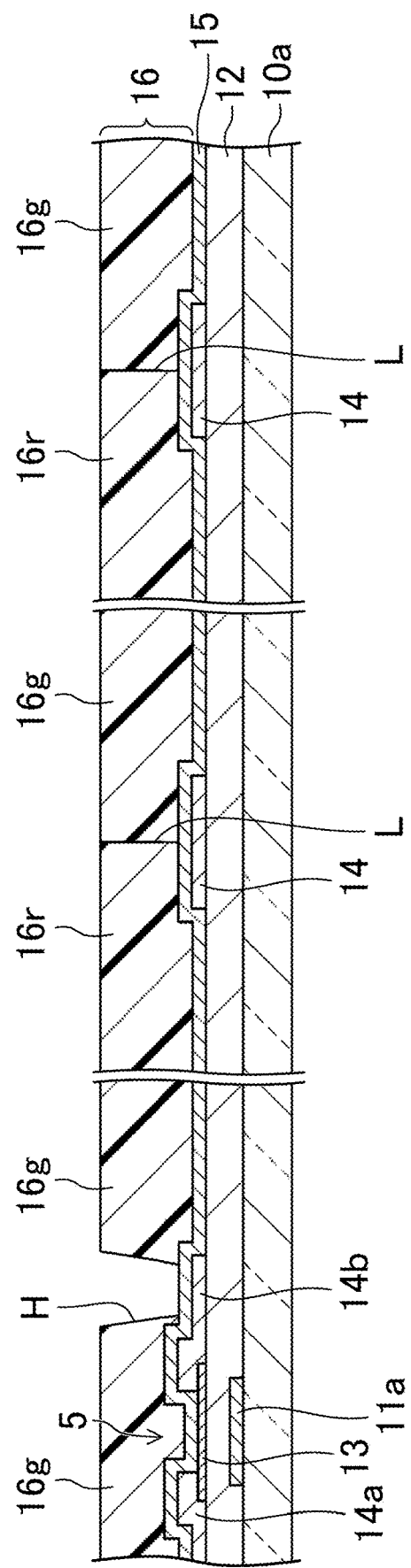
FIG. 5 is a first cross-sectional view illustrating a part of a manufacturing step of the active matrix substrate that is a component of the liquid crystal display device according to the first embodiment of the disclosure.

Subsequently, an inorganic insulating film (thickness of approximately 750 nm) such as a silicon nitride film or a silicon oxide film is formed on the surface of the substrate on which the TFTs 5 are formed, by, for example, plasma CVD to form the interlayer insulating film 15, and then a red, green, or blue colored acrylic photosensitive resin (thickness of approximately 1.6 μm) is applied by, for example, spin coating or slit coating, and the applied photosensitive resin is partially exposed, and then patterned by development, thereby forming a colored layer having a selected color (e.g., the red layer 16r). Further, the similar step is repeated for the other two colors to form the colored layers of the other two colors (e.g., the green layer 16g and the blue layer), thereby forming the color filters 16 including the contact holes H as illustrated in FIG. 5 (color filter forming step).

Figure 6:
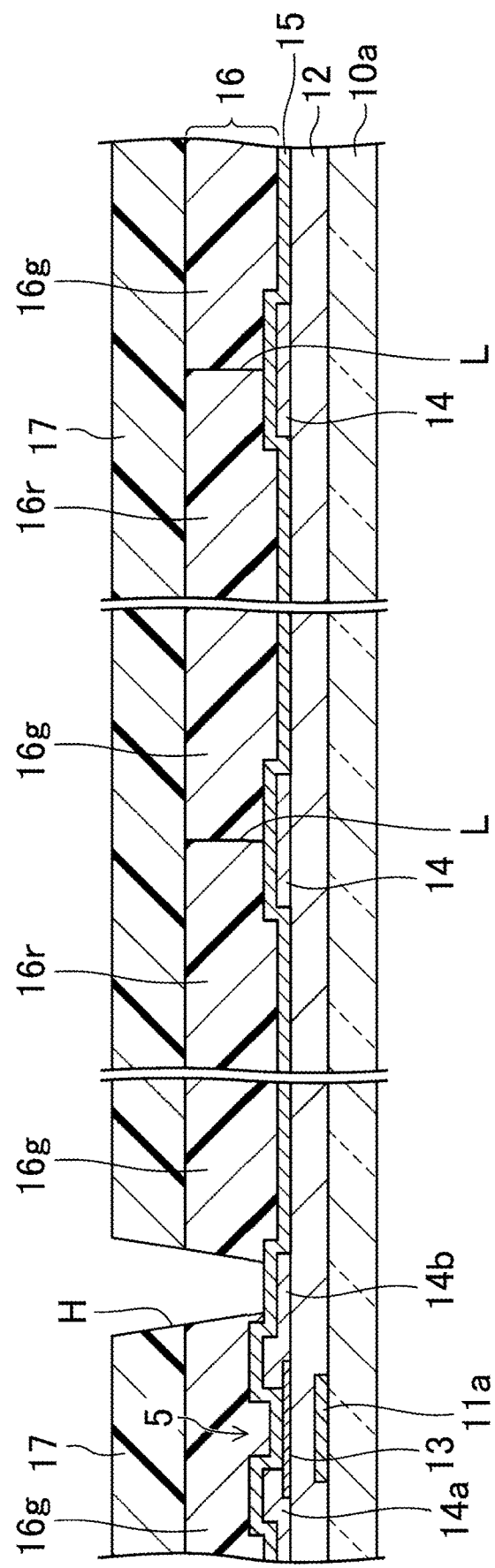
FIG. 6 is a second cross-sectional view subsequent to FIG. 5, illustrating a part of the manufacturing step of the active matrix substrate that is a component of the liquid crystal display device according to the first embodiment of the disclosure.

Thereafter, an acrylic photosensitive resin (thickness of approximately 2.0 μm) is applied to the surface of the substrate on which the color filters 16 are formed, by, for example, spin coating or slit coating, and the applied photosensitive resin is partially exposed and then patterned by development, thereby forming the organic protection film 17 including the contact holes H as illustrated in FIG. 6.

Figure 7:
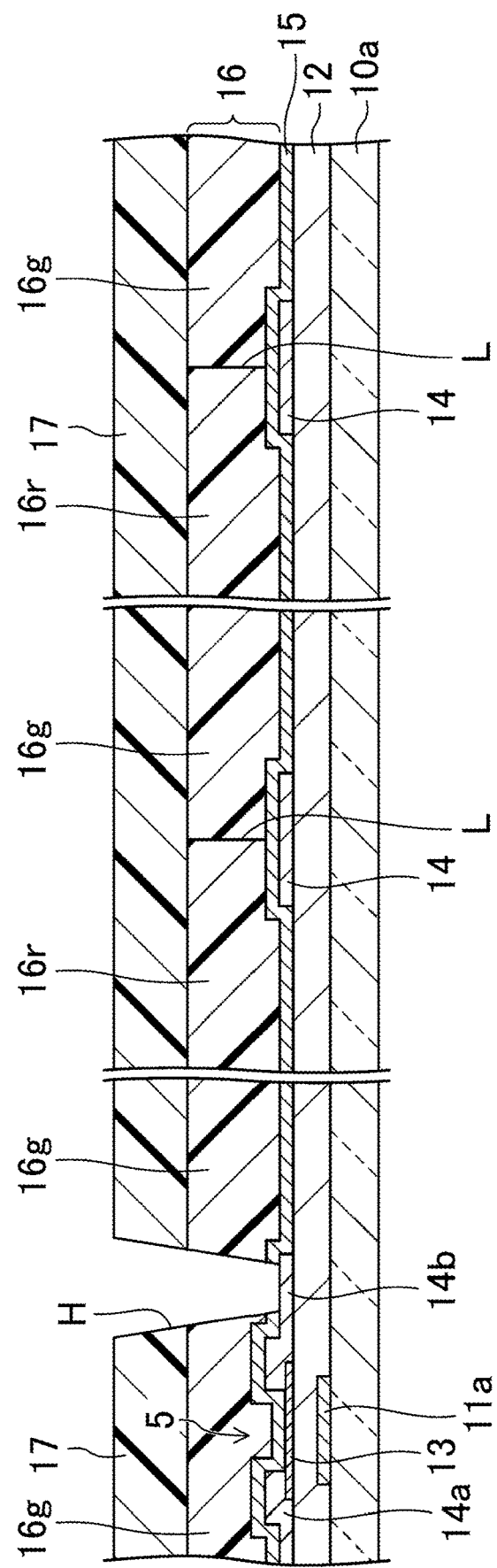
FIG. 7 is a third cross-sectional view subsequent to FIG. 6, illustrating a part of the manufacturing step of the active matrix substrate that is a component of the liquid crystal display device according to the first embodiment of the disclosure.

Further, the interlayer insulating film 15 exposed from the contact holes H is etched to form the contact holes H in the interlayer insulating film 15 as illustrated in FIG. 7, thereby exposing the drain electrodes 14b from the contact holes H.

Figure 8:
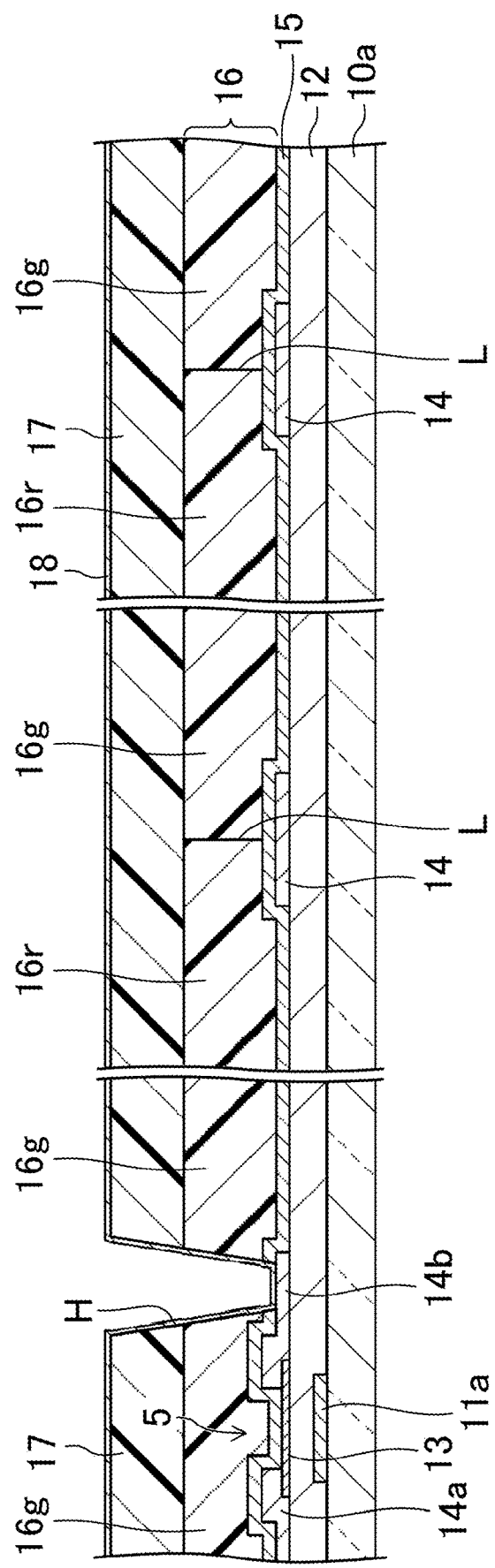
FIG. 8 is a fourth cross-sectional view subsequent to FIG. 7, illustrating a part of the manufacturing step of the active matrix substrate that is a component of the liquid crystal display device according to the first embodiment of the disclosure.
Figure 9:
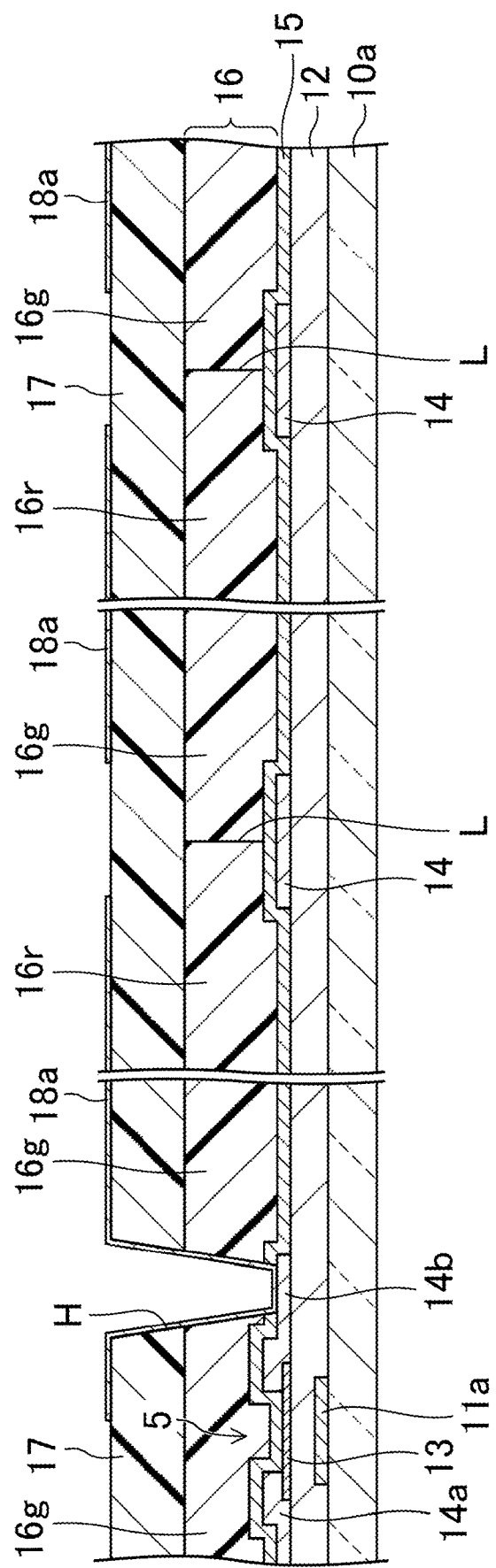
FIG. 9 is a fifth cross-sectional view subsequent to FIG. 8, illustrating a part of the manufacturing step of the active matrix substrate that is a component of the liquid crystal display device according to the first embodiment of the disclosure.

Subsequently, as illustrated in FIG. 8, a first transparent conductive film 18 such as the ITO film or the IZO film with a thickness of approximately 70 nm is formed on the surface of the substrate on which the contact holes H are formed in the interlayer insulating film 15, by, for example, sputtering, and then the first transparent conductive film 18 is subjected to photolithography, etching, and resist stripping and cleaning, thereby forming the pixel electrodes 18a as illustrated in FIG. 9 (first transparent electrode forming step).

Figure 10:
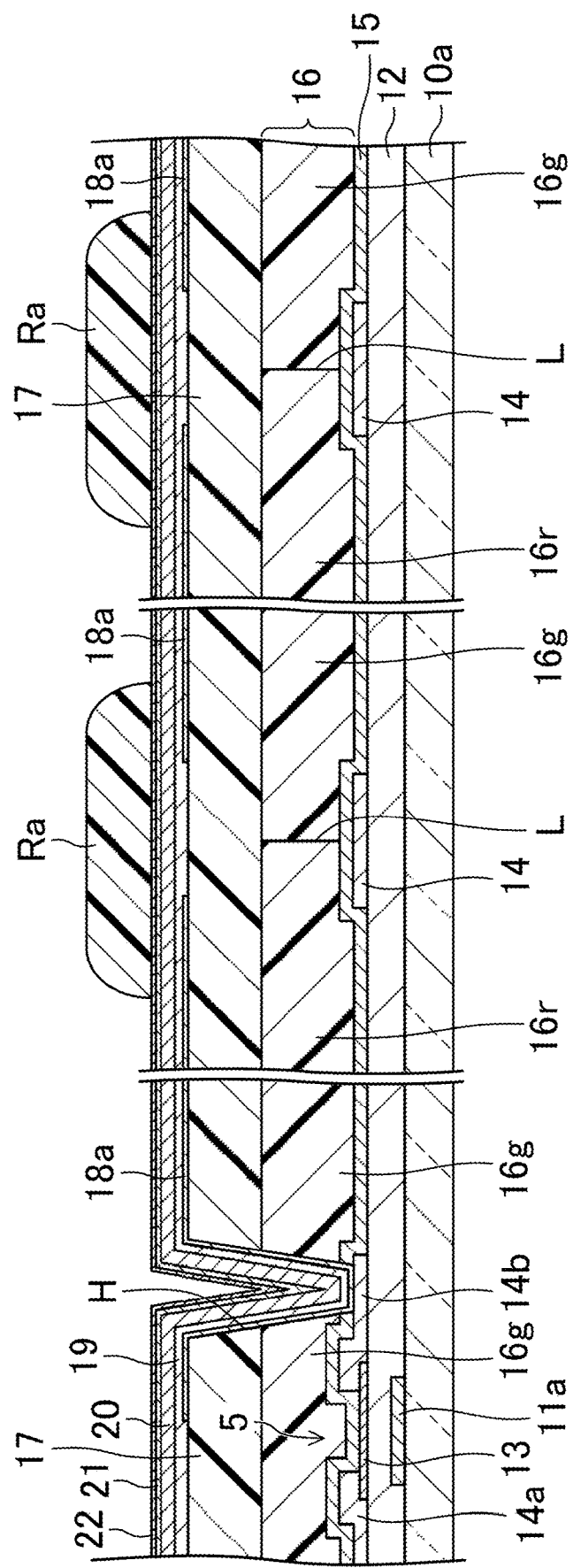
FIG. 10 is a sixth cross-sectional view subsequent to FIG. 9, illustrating a part of the manufacturing step of the active matrix substrate that is a component of the liquid crystal display device according to the first embodiment of the disclosure.

Thereafter, an inorganic insulating film 19 such as a silicon nitride film with a thickness of approximately 100 nm is formed on the surface of the substrate on which the pixel electrodes 18a are formed, by, for example, plasma CVD, and a first metal film 20 such as a molybdenum-tungsten alloy film with a thickness of approximately 60 nm, an intermediate film 21 such as an IZO film with a thickness of approximately 60 nm, and a second metal film 22 such as a molybdenum film with a thickness of approximately 6 nm are formed by sputtering, and then resists Ra are formed on the surface of the substrate by photolithography as illustrated in FIG. 10.

Figure 11:
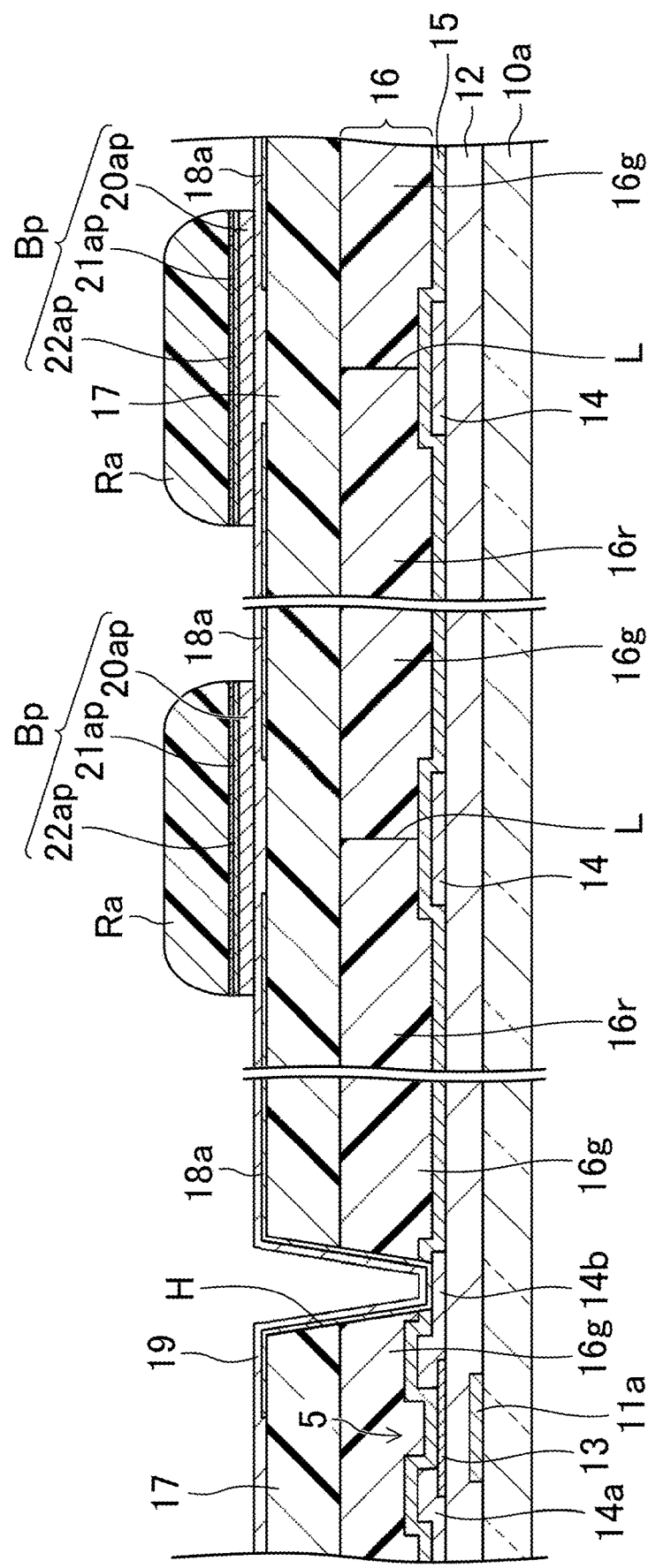
FIG. 11 is a seventh cross-sectional view subsequent to FIG. 10, illustrating a part of the manufacturing step of the active matrix substrate that is a component of the liquid crystal display device according to the first embodiment of the disclosure.

Further, the first metal film 20, the intermediate film 21, and the second metal film 22 exposed from the resist Ra are subjected to wet etching using a mixed acid solution of phosphoric acid, nitric acid, and acetic acid, thereby forming the antireflection forming layer Bp in which a first metal layer 20ap, an intermediate layer 21ap, and a second metal layer 22ap are layered as illustrated in FIG. 11 (antireflection forming layer forming step).

Figure 12:
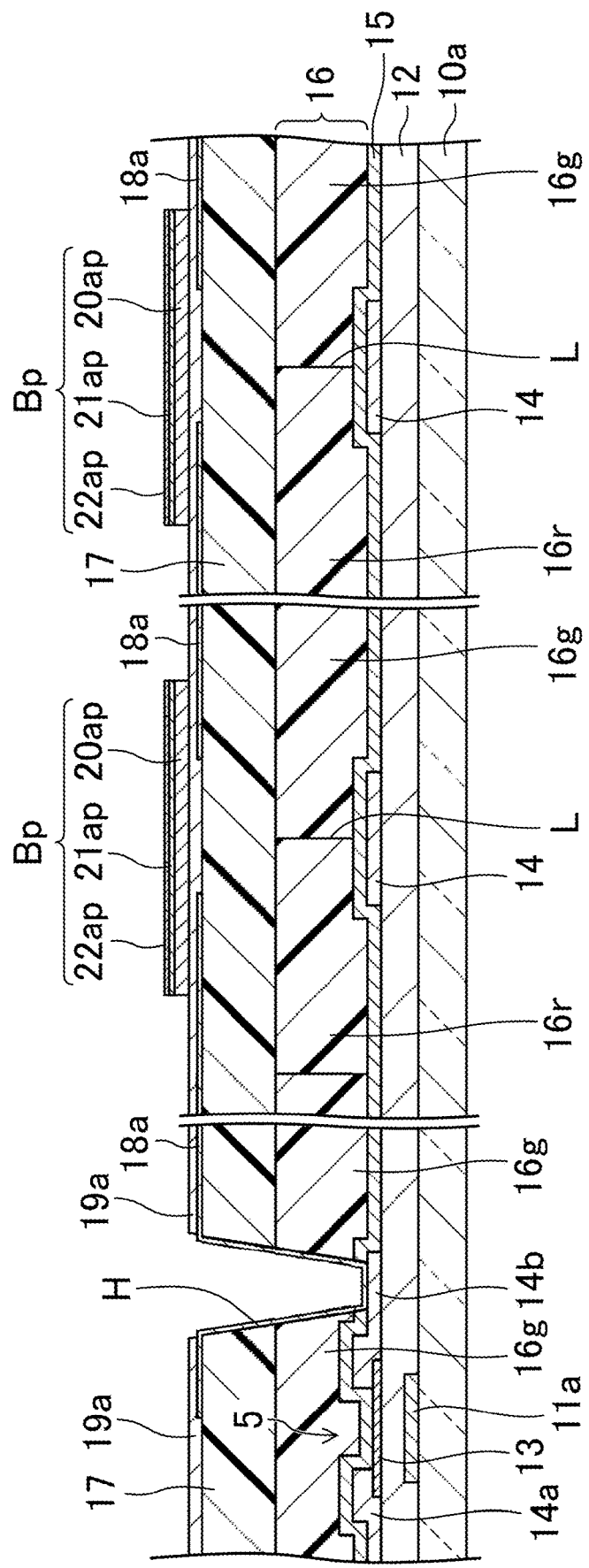
FIG. 12 is an eighth cross-sectional view subsequent to FIG. 11, illustrating a part of the manufacturing step of the active matrix substrate that is a component of the liquid crystal display device according to the first embodiment of the disclosure.

Subsequently, resist stripping and cleaning is performed on the resists Ra, and then the inorganic insulating film 19 is subjected to photolithography, etching, and resist stripping and cleaning, thereby forming the inorganic protection film 19a as illustrated in FIG. 12 (inorganic protection film forming step).

Figure 13:
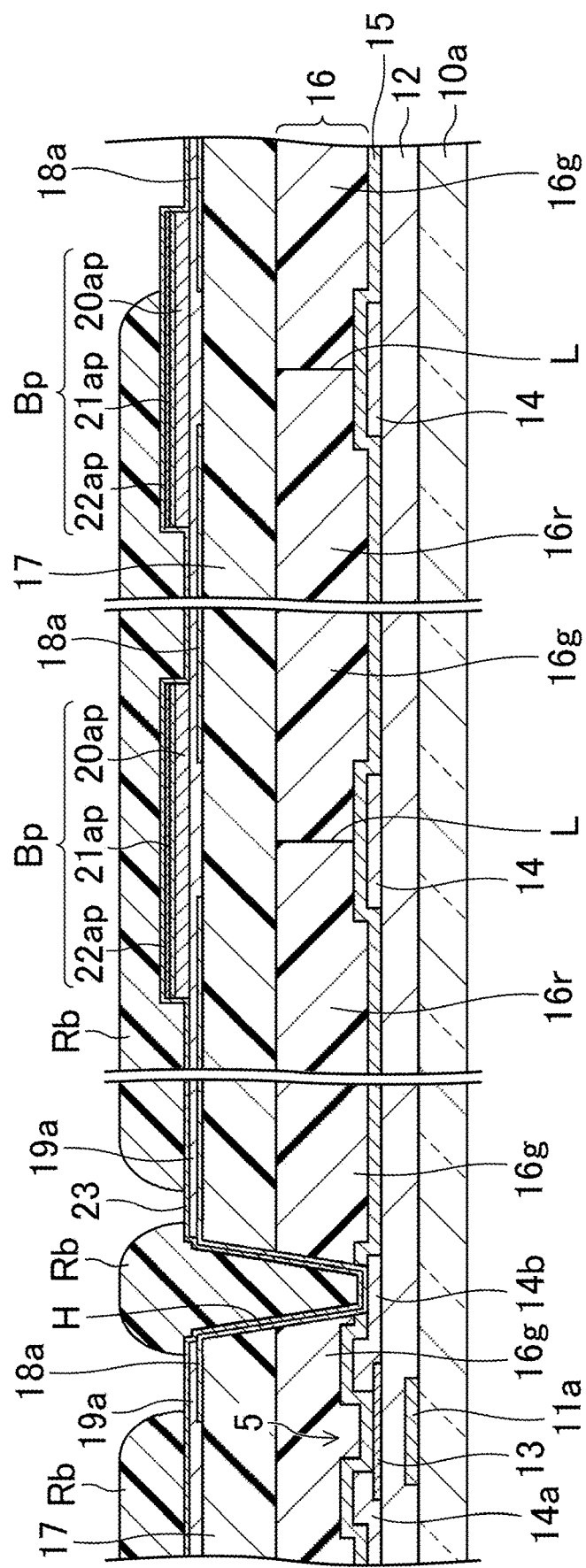
FIG. 13 is a ninth cross-sectional view subsequent to FIG. 12, illustrating a part of the manufacturing step of the active matrix substrate that is a component of the liquid crystal display device according to the first embodiment of the disclosure.

Thereafter, a second transparent conductive film 23 made of the ITO film or the IZO film with a thickness of approximately 70 nm is formed on the surface of the substrate on which the inorganic protection film 19a is formed, by, for example, sputtering, and then resists Rb are formed on the surface of the substrate by photolithography as illustrated in FIG. 13.

Figure 14:
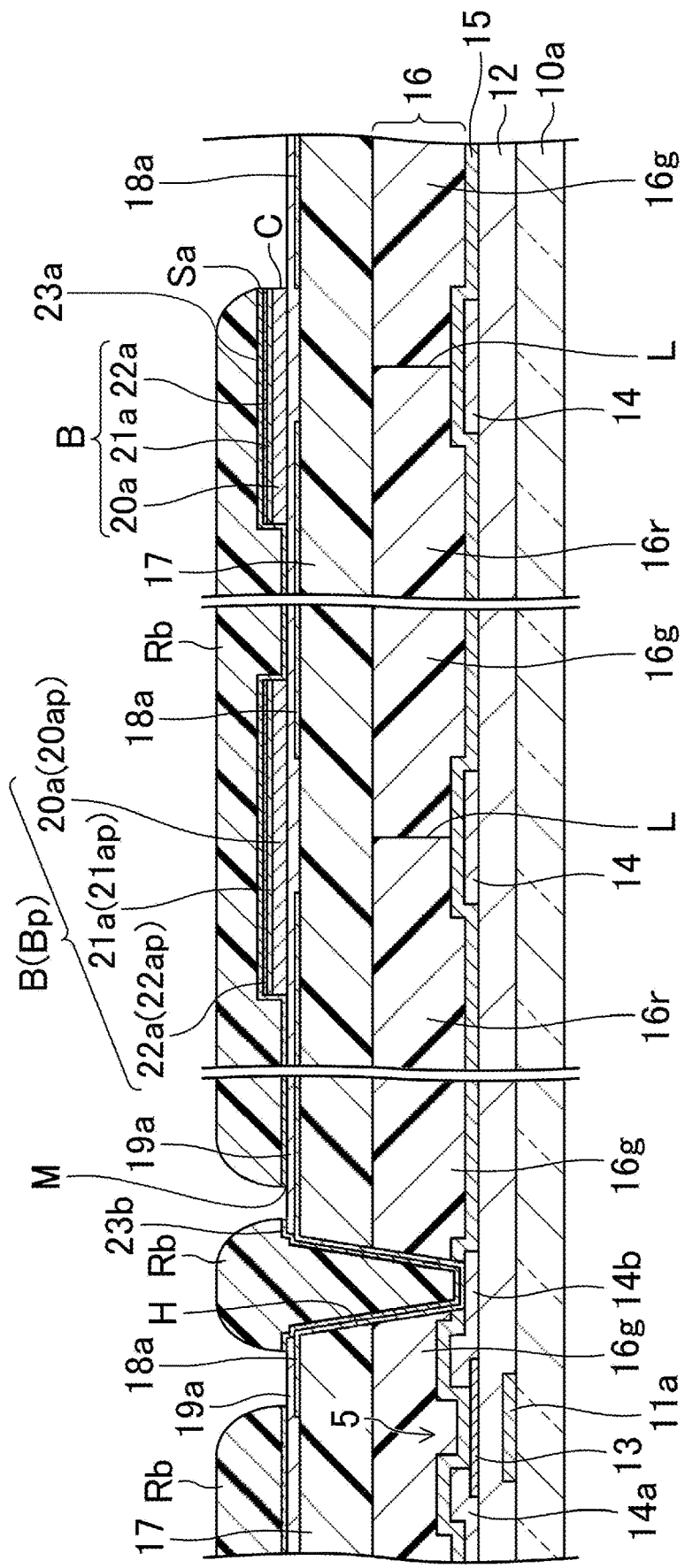
FIG. 14 is a tenth cross-sectional view subsequent to FIG. 13, illustrating a part of the manufacturing step of the active matrix substrate that is a component of the liquid crystal display device according to the first embodiment of the disclosure.

Further, the second transparent conductive film 23 and the antireflection forming layer Bp exposed from the resist Rb are subjected to wet etching using the mixed acid solution of phosphoric acid, nitric acid, and acetic acid, thereby forming the common electrode 23a including the slit Sa and the opening M, the transparent conductive layer 23b, and the antireflection layers B in which the first metal layer 20a, the intermediate layer 21a, and the second metal layer 22a are layered and including the cut-away portions C as illustrated in FIG. 14 (second transparent electrode forming step).

Subsequently, an acrylic photosensitive resin (thickness of approximately 2.5 μm) is applied to the surface of the substrate on which the common electrode 23a and the like is formed, by, for example, spin coating or slit coating, and the applied photosensitive resin is partially exposed and then patterned by developing, thereby forming the resin-filled layers 24.

Further, an inorganic insulating film (thickness of approximately 30 nm) such as a silicon nitride film is formed on the surface of the substrate on which the resin-filled layers 24 are formed, by, for example, plasma CVD, thereby forming the surface protection film 25.

Finally, a polyimide resin film is applied to the entire substrate on which the surface protection film 25 is formed, by, for example, a printing method, and then the resin film is subjected to baking and rubbing treatment, thereby forming the alignment film 26.

As described above, the active matrix substrate 30a can be manufactured.

Further, the active matrix substrate 30a manufactured as described above and the counter substrate 40 are bonded with a sealing member, and a liquid crystal material is contained between the active matrix substrate 30a and the counter substrate 40 to form the liquid crystal layer 45, thereby manufacturing the liquid crystal display device 50.

As described above, according to the active matrix substrate 30a, the liquid crystal display device 50 including the active matrix substrate 30a, and the method of manufacturing the active matrix substrate 30a of the present embodiment, in the second transparent electrode forming step, the antireflection forming layer Bp exposed from the slit Sa of the common electrode 23a is removed, thereby forming the antireflection layer B provided with the cut-away portion C so as not to overlap both the end portions of the slit Sa. Accordingly, since the antireflection layer B is not exposed from the slit Sa of the common electrode 23a, the alignment disorder of the liquid crystal layer 45 is suppressed, and the occurrence of the image sticking and the afterimage at the end portions of the slit Sa formed in the common electrode 23a can be suppressed.

According to the active matrix substrate 30a, the liquid crystal display device 50 including the active matrix substrate 30a, and the method of manufacturing the active matrix substrate 30a of the present embodiment, since both the end portions of the slit Sa of the common electrode 23a overlap the antireflection forming layer Bp serving as the antireflection layer B, an ultra-high definition pixel size of 1000 ppi to 1200 ppi or more for use in a head-mounted display or the like can be realized.

According to the active matrix substrate 30a, the liquid crystal display device 50 including the active matrix substrate 30a, and the method of manufacturing the active matrix substrate 30a of the present embodiment, since the common electrode 23a is provided on the antireflection layer B in which the first metal layer 20a, the intermediate layer 21a, and the second metal layer 22a are layered in order, reflection of light incident from the liquid crystal layer 45 side can be effectively suppressed without adding a manufacturing step.

Second Embodiment

Figure 15:
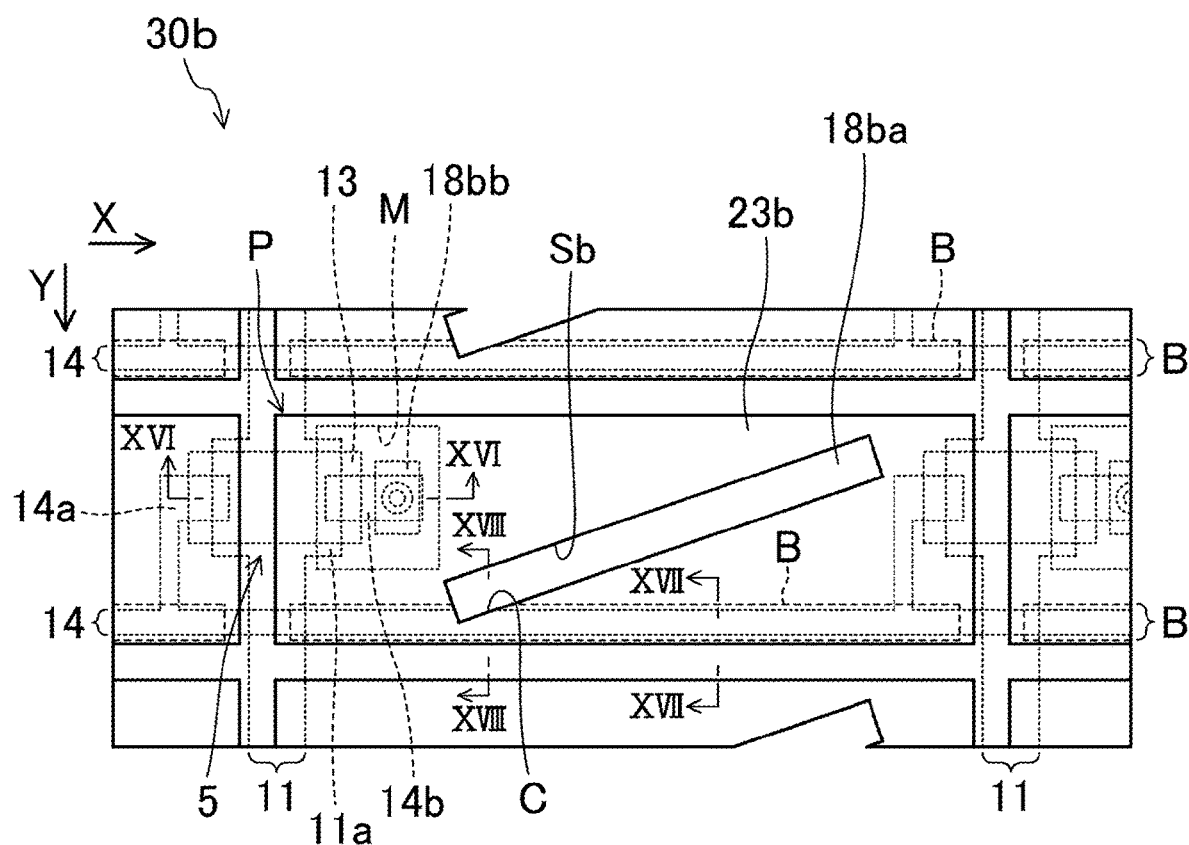
FIG. 15 is a plan view of an active matrix substrate that is a component of a liquid crystal display device according to a second embodiment of the disclosure.
Figure 16:
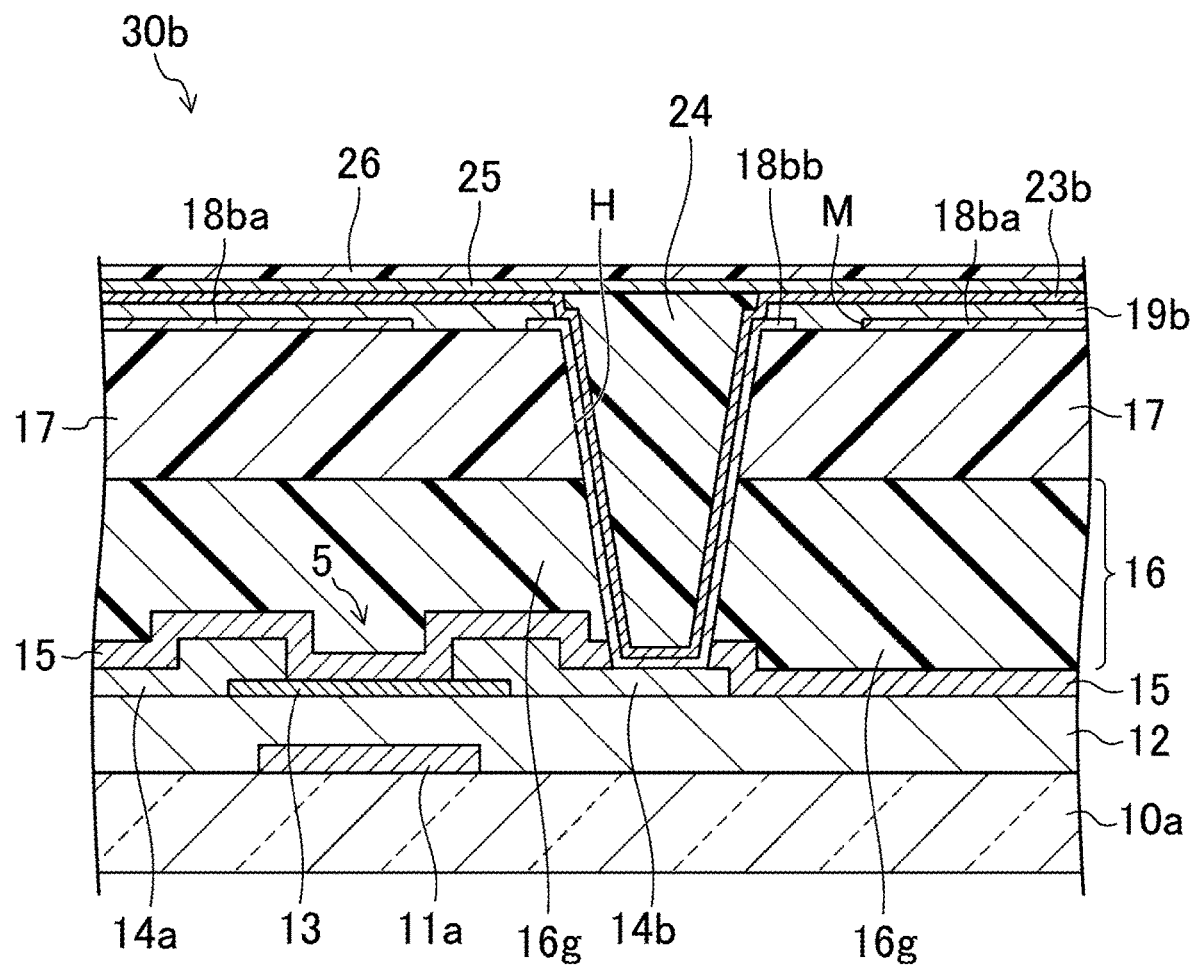
FIG. 16 is a cross-sectional view of the active matrix substrate taken along line XVI-XVI in FIG. 15.
Figure 17:
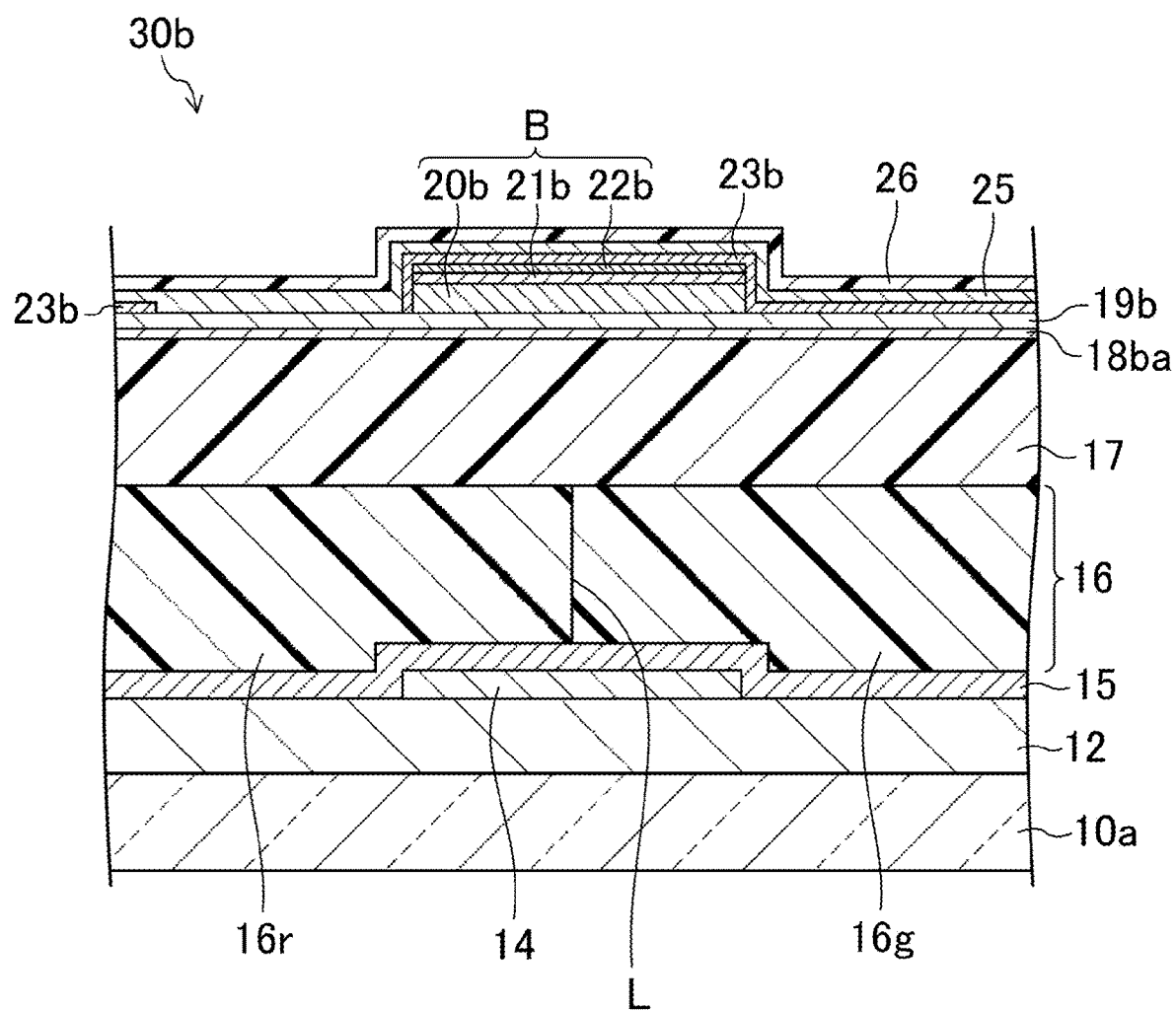
FIG. 17 is a cross-sectional view of the active matrix substrate taken along line XVII-XVII in FIG. 15.
Figure 18:
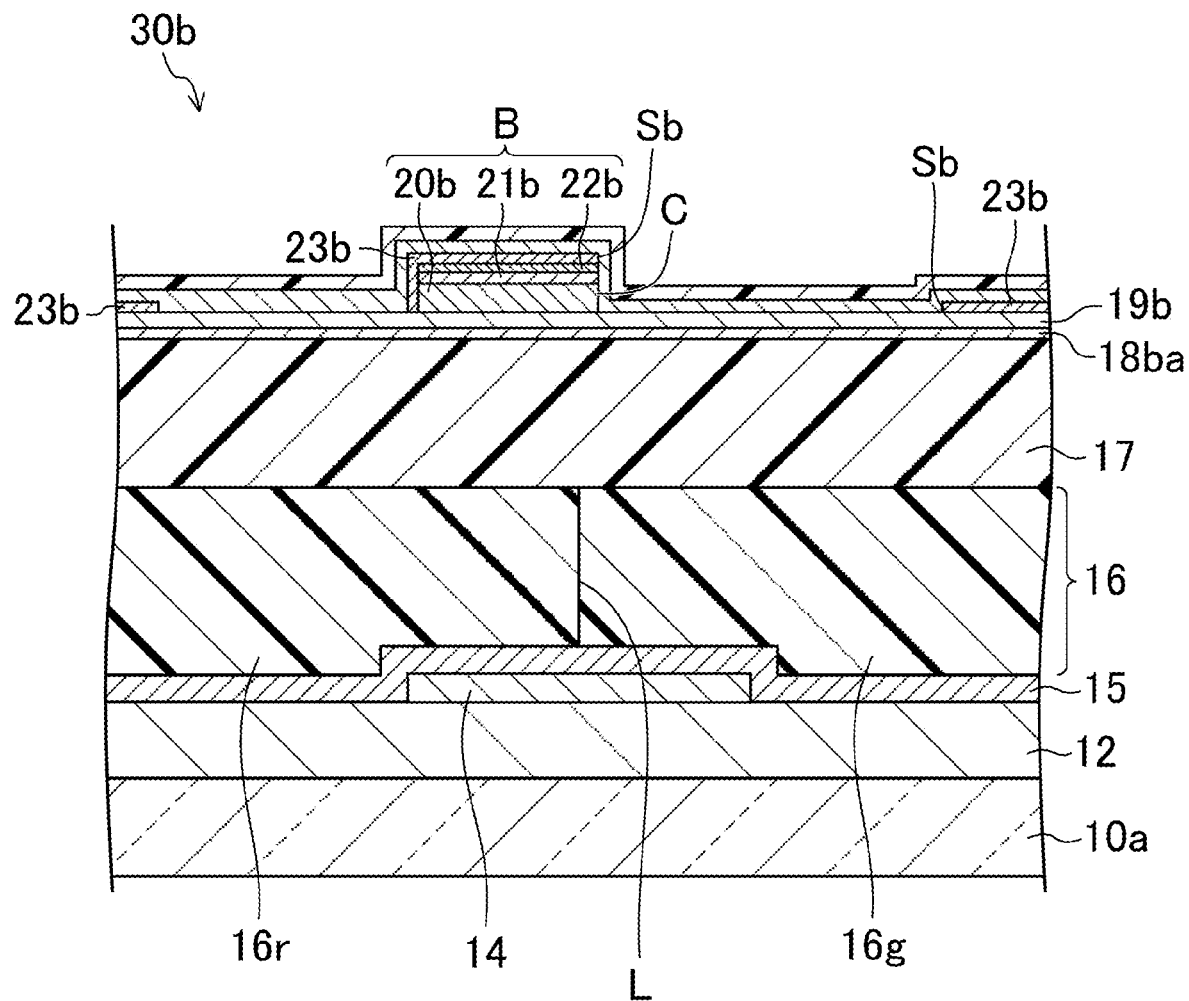
FIG. 18 is a cross-sectional view of the active matrix substrate taken along line XVIII-XVIII in FIG. 15.
Figure 19:
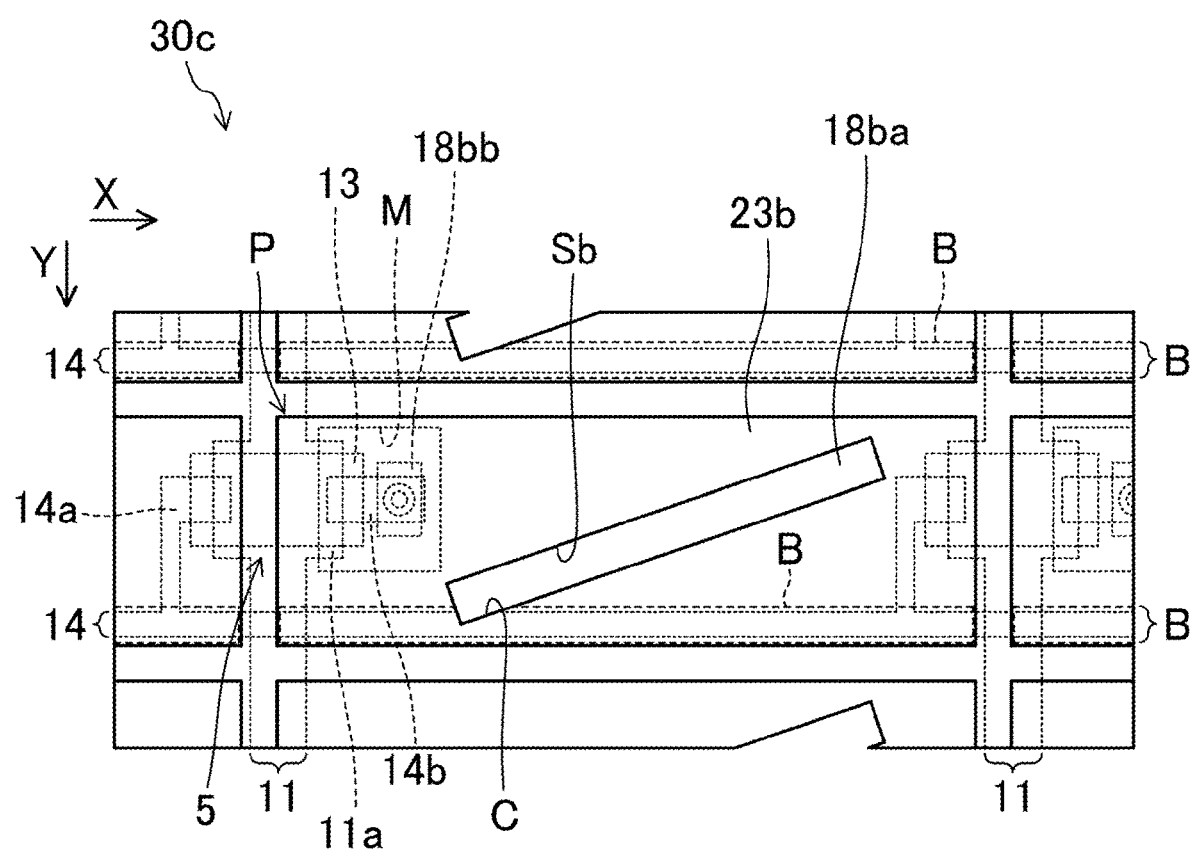
FIG. 19 is a plan view of a modified example of the active matrix substrate that is a component of the liquid crystal display device according to the second embodiment of the disclosure.

FIGS. 15 to 25 illustrate a second embodiment of the active matrix substrate, the liquid crystal display device including the active matrix substrate, and the method of manufacturing the active matrix substrate. FIG. 15 is a plan view of an active matrix substrate 30b that is a component of the liquid crystal display device according to the present embodiment. FIGS. 16, 17, and 18 are cross-sectional views of the active matrix substrate 30b taken along lines XVI-XVI, XVII-XVII, and XVIII-XVIII in FIG. 15. FIG. 19 is a plan view of an active matrix substrate 30c as a modified example of the active matrix substrate 30b. Furthermore, in the following embodiments, portions identical to those in FIGS. 1 to 14 are denoted by the same reference signs, and a detailed description thereof are omitted.

In the first embodiment, the liquid crystal display device 50 including the active matrix substrate 30a in which the common electrode 23a is provided above the pixel electrodes 18a and the slits Sa are formed in the common electrode 23a is exemplified. In the present embodiment, the liquid crystal display device including the active matrix substrate 30b in which pixel electrodes 23b are provided above a common electrode 18ba and slits Sb are formed in the pixel electrodes 23b will be exemplified.

The liquid crystal display device according to the present embodiment includes the active matrix substrate 30b having a COA structure, the counter substrate 40 (see FIGS. 2 to 4) provided so as to face the active matrix substrate 30b, and the liquid crystal layer 45 (see FIGS. 2 to 4) provided between the active matrix substrate 30b and the counter substrate 40. In the liquid crystal display device according to the present embodiment, the plurality of subpixels P are provided in a matrix shape in a display region, as in the liquid crystal display device 50 according to the first embodiment. In the display region, as in the liquid crystal display device 50 according to the first embodiment, subpixels P having the red layers 16r, subpixels P having the green layers 16g, and subpixels P having the blue layers are provided so as to be adjacent to one another.

As illustrated in FIGS. 16 to 18, the active matrix substrate 30b includes the base substrate 10a such as a glass substrate, the plurality of TFTs 5 provided on the base substrate 10a corresponding to the plurality of subpixels P, the color filters 16 provided on the TFTs 5, respectively, the organic protection film 17 provided on the color filters 16, a common electrode 18ba, as a first transparent electrode, provided on the organic protection film 17, an inorganic protection film 19b provided on the common electrode 18ba, a plurality of the pixel electrodes 23b, as second transparent electrodes, provided on the inorganic protection film 19b, the surface protection film 25 provided on the pixel electrodes 23b, and the alignment film 26 provided on the surface protection film 25. The active matrix substrate 30b includes the plurality of gate lines 11 and the plurality of source lines 14 as in the active matrix substrate 30a of the first embodiment.

As illustrated in FIG. 15, the common electrode 18ba is provided on the organic protection film 17 in common to the plurality of subpixels P. As illustrated in FIGS. 15 and 16, the opening M is provided in a rectangular shape in the common electrode 18ba so as to overlap the contact hole H so that the opening M penetrates the common electrode 18ba. As illustrated in FIGS. 15 and 16, inside the opening M of the common electrode 18ba, a transparent conductive layer 18bb formed in the same layer with the same material as the common electrode 18ba is provided in a recessed shape separated from the common electrode 18ba so as to overlap a bottom face and a side surface of the contact hole H.

As illustrated in FIG. 15, the pixel electrode 23b is provided in a rectangular shape. The plurality of pixel electrodes 23b are provided in a matrix shape corresponding to the plurality of subpixels P, respectively. The pixel electrode 23b constitutes an auxiliary capacity of each subpixel P together with the common electrode 18ba and the inorganic protection film 19b provided between the pixel electrode 23b and the common electrode 18ba. As illustrated in FIG. 16, the pixel electrode 23b is electrically connected to the drain electrode 14b of the TFT 5 via the transparent conductive layer 18bb provided in the contact hole H. As illustrated in FIGS. 15 and 18, the pixel electrode 23b is provided with the slit Sb in a belt shape for aligning the liquid crystal layer 45 so that the slit Sb penetrates the pixel electrode 23b. One end portion (lower left side in FIG. 15) of the slit Sb is provided so as to intersect the antireflection forming layer Bp described later. As illustrated in FIG. 16, the resin-filled layer 24 is provided between the pixel electrode 23b and the surface protection film 25. As illustrated in FIGS. 15, 17, and 18, between the pixel electrode 23b and the inorganic protection film 19b, on the inorganic protection film 19b, an antireflection layer B is provided at a boundary portion L between the colored layers of different colors so as to overlap the boundary portion L.

As illustrated in FIG. 15, the antireflection layers B are disconnectedly provided in a belt shape for each subpixel P so as to overlap the source lines 14, respectively. As illustrated in FIGS. 17 and 18, the antireflection layer B includes a first metal layer 20b, an intermediate layer 21b, and a second metal layer 22b layered in order on the inorganic protection film 19b, and is configured to suppress reflection of light incident from the liquid crystal layer 45 side by reflecting light incident from the liquid crystal layer 45 side by the second metal layer 22b, reflecting light transmitted through the second metal layer 22b without being reflected by the second metal layer 22b by the first metal layer 20b, and causing light reflected by the second metal layer 22b and light reflected by the first metal layer 20b to cancel each other. Here, the first metal layer 20b is made of, for example, a metal film such as a tungsten film, a molybdenum film, or a molybdenum-tungsten alloy film with a thickness of approximately 60 nm or greater. The intermediate layer 21b is made of, for example, an inorganic insulating film such as a silicon nitride film or a transparent conductive film such as an ITO film or an IZO film with a refractive index of approximately from 1.8 to 2.1 and a thickness of approximately from 40 nm to 90 nm. The second metal layer 22b is made of, for example, a metal film such as a tungsten film or a molybdenum film with a thickness of approximately from 2 nm to 15 nm. As illustrated in FIGS. 15 and 18, the antireflection layer B is provided with the cut-away portion C so as not to overlap one end portion (lower left side in FIG. 15) of the slit Sb. Here, an end face of the cut-away portion C and an end face of an end portion of the slit Sb corresponding to the cut-away portion C are provided to be flush with each other.

In the present embodiment, the active matrix substrate 30b is exemplified in which, in each subpixel P, both the end faces of the antireflection layer B in the length direction (X direction in FIG. 15) are disposed inside both the end faces of the pixel electrode 23b in the length direction (X direction in FIG. 15), but the active matrix substrate 30c as illustrated in FIG. 19 may be used. Specifically, in the active matrix substrate 30c, as illustrated in FIG. 19, both the end faces of the antireflection layer B in the length direction (X direction in the drawing) are flush with both the end faces of the pixel electrodes 23b in the length direction (X direction in the drawing), respectively.

In the liquid crystal display device of the present embodiment, as in the liquid crystal display device 50 of the first embodiment, a predetermined voltage is applied to the liquid crystal layer 45 disposed between each pixel electrode 23b and the common electrode 18ba and to the auxiliary capacity, and the alignment state of the liquid crystal layer 45 is changed by an electrical field generated in a direction along the surface of the substrate, that is, in a transverse direction, thereby adjusting the transmittance of light passing through the panel of each subpixel P to display images.

Next, a method of manufacturing the liquid crystal display device of the present embodiment will be described, focusing on a method of manufacturing the active matrix substrate 30b. FIGS. 20 to 25 are first to sixth cross-sectional views, respectively, sequentially illustrating a part of a manufacturing step of the active matrix substrate 30b. In the cross-sectional views of FIGS. 20 to 25, a right side portion, a center portion, and a left side portion in the drawing across a break line indicate portions corresponding to the cross-sectional views of FIGS. 16, 17, and 18, respectively.

Figure 20:
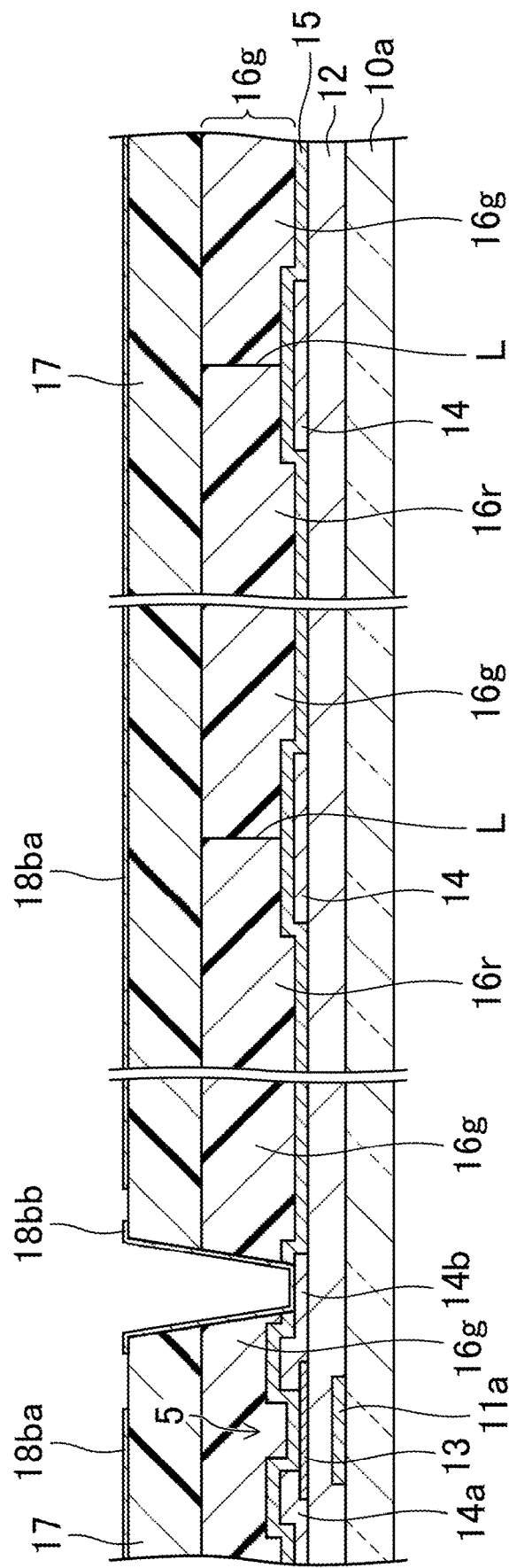
FIG. 20 is a first cross-sectional view illustrating a part of the manufacturing step of the active matrix substrate that is a component of the liquid crystal display device according to the second embodiment of the disclosure.

First, in the method of manufacturing the active matrix substrate 30a according to the first embodiment, a first transparent conductive film 18 (see FIG. 8) such as an ITO film or an IZO film is formed on the surface of the substrate on which the contact holes H are formed in the interlayer insulating film 15, by, for example, sputtering, and then the first transparent conductive film 18 is subjected to photolithography, etching, and resist stripping and cleaning, thereby forming the common electrode 18ba including the opening M and the transparent conductive layer 18bb as illustrated in FIG. 20 (first transparent electrode forming step).

Figure 21:
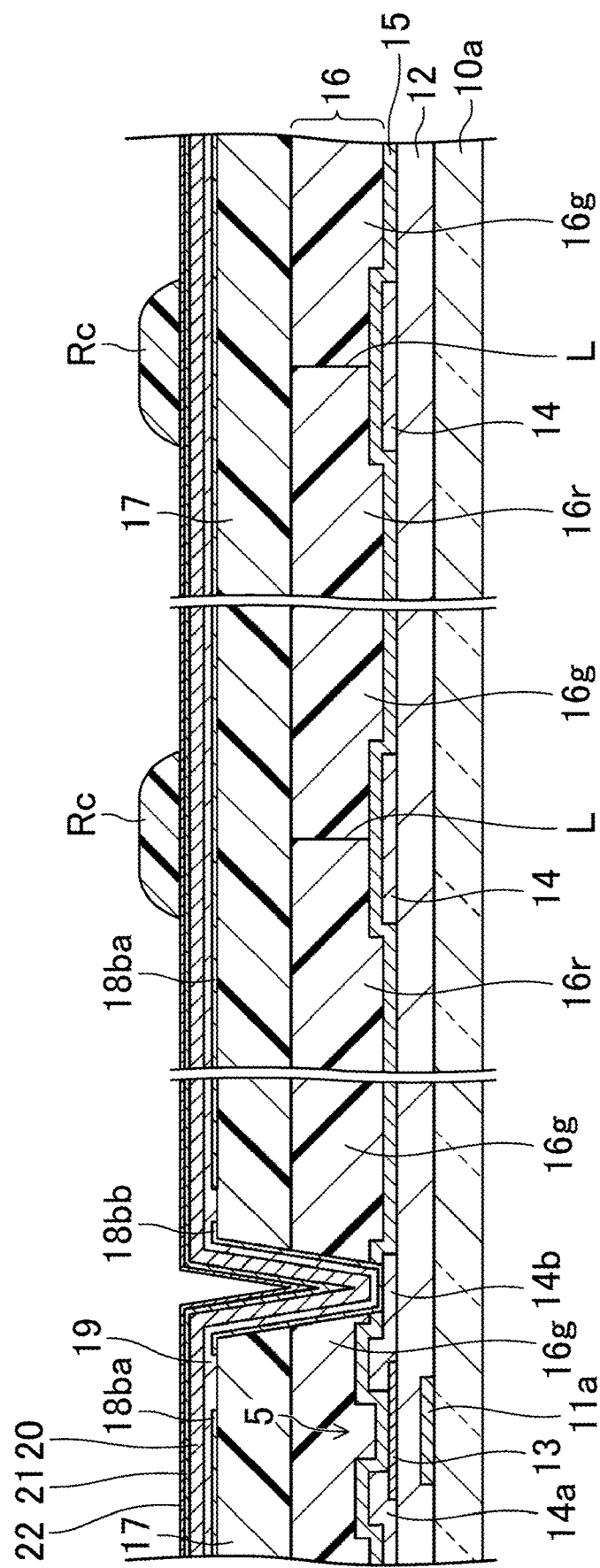
FIG. 21 is a second cross-sectional view subsequent to FIG. 20, illustrating a part of the manufacturing step of the active matrix substrate that is a component of the liquid crystal display device according to the second embodiment of the disclosure.

Subsequently, the inorganic insulating film 19 such as a silicon nitride film with a thickness of approximately 100 nm is formed on the surface of the substrate on which the common electrodes 18ba and the like are formed, by, for example, plasma CVD, and the first metal film 20 such as a molybdenum-tungsten alloy film with a thickness of approximately 60 nm, the intermediate film 21 such as a silicon nitride film with a thickness of approximately 60 nm, and the second metal film 22 such as a molybdenum film with a thickness of approximately 6 nm are formed by sputtering, and then resists Rc are formed on the surface of the substrate by photolithography as illustrated in FIG. 21.

Figure 22:
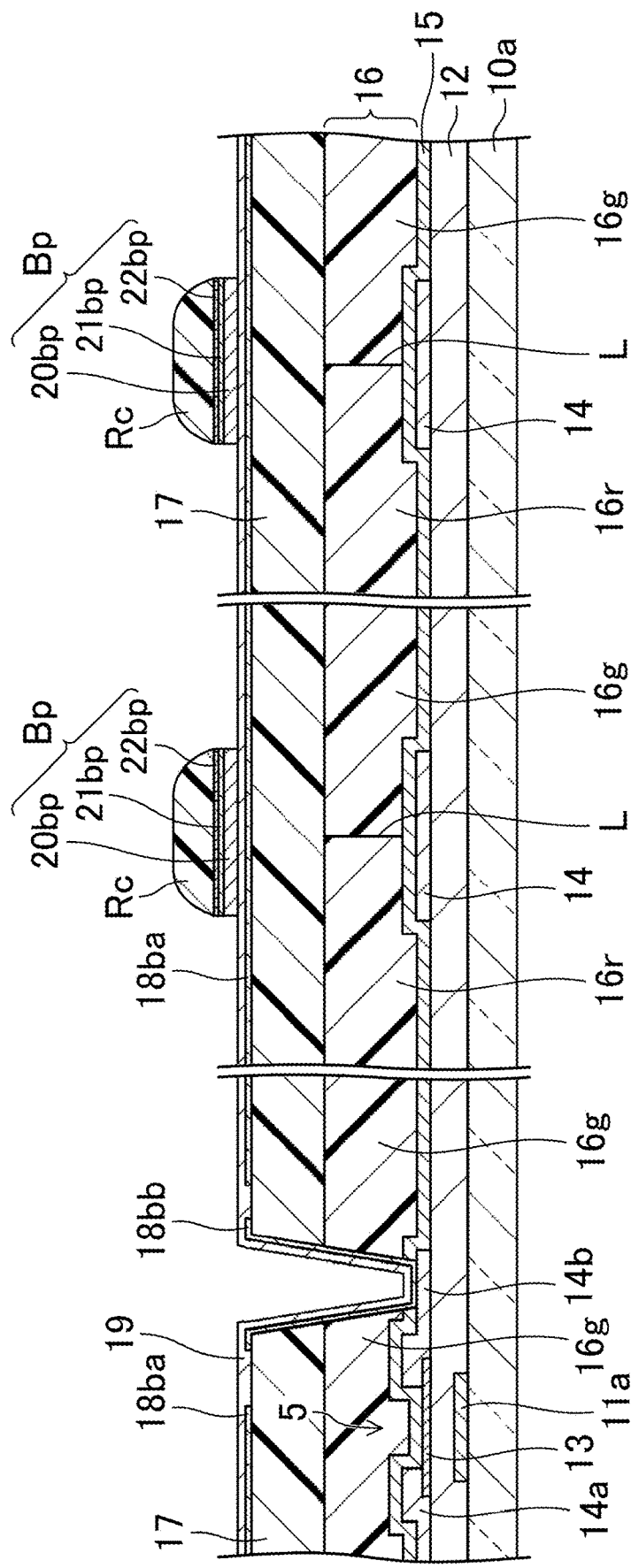
FIG. 22 is a third cross-sectional view subsequent to FIG. 21, illustrating a part of the manufacturing step of the active matrix substrate that is a component of the liquid crystal display device according to the second embodiment of the disclosure.

Thereafter, the first metal film 20, the intermediate film 21, and the second metal film 22 exposed from the resist Rc are subjected to dry etching using a fluorine-based gas, thereby forming the antireflection forming layer Bp in which a first metal layer 20bp, an intermediate layer 21bp, and a second metal layer 22bp are layered as illustrated in FIG. 22 (antireflection forming layer forming step).

Figure 23:
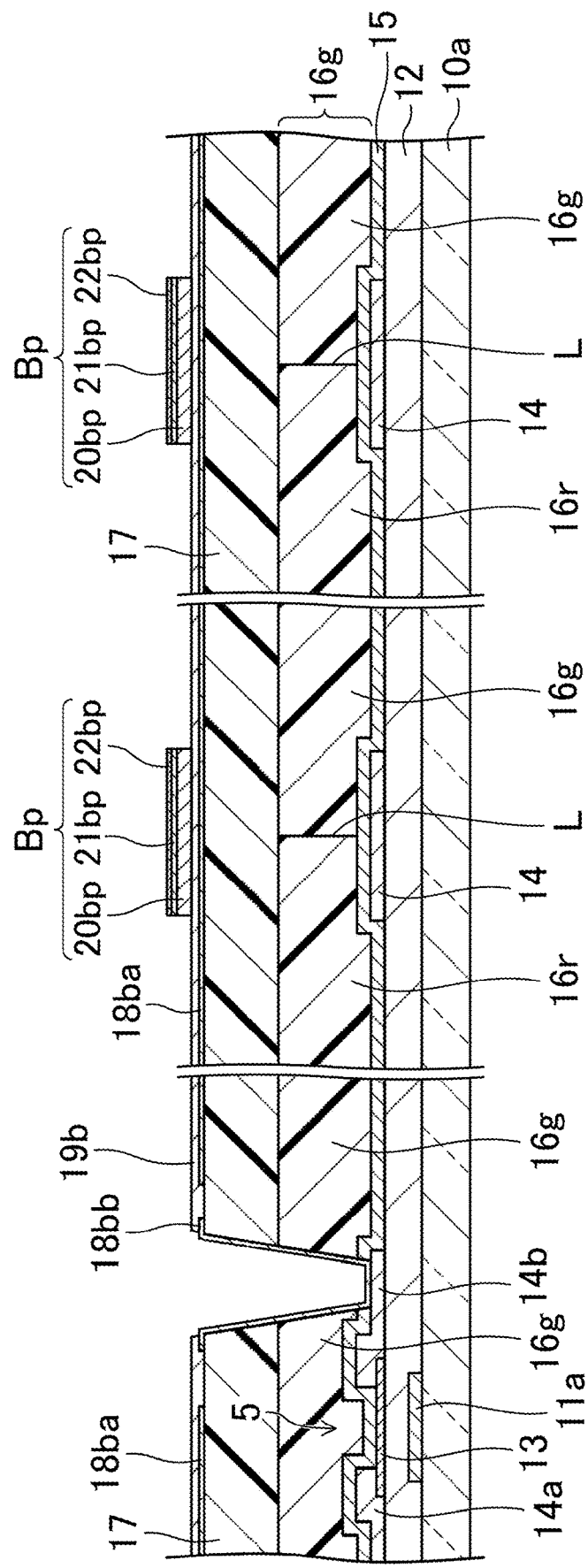
FIG. 23 is a fourth cross-sectional view subsequent to FIG. 22, illustrating a part of the manufacturing step of the active matrix substrate that is a component of the liquid crystal display device according to the second embodiment of the disclosure.

Further, resist stripping and cleaning is performed on the resists Rc, and then the inorganic insulating film 19 is subjected to photolithography, etching, and resist stripping and cleaning, thereby forming the inorganic protection film 19b as illustrated in FIG. 23 (inorganic protection film forming step).

Figure 24:
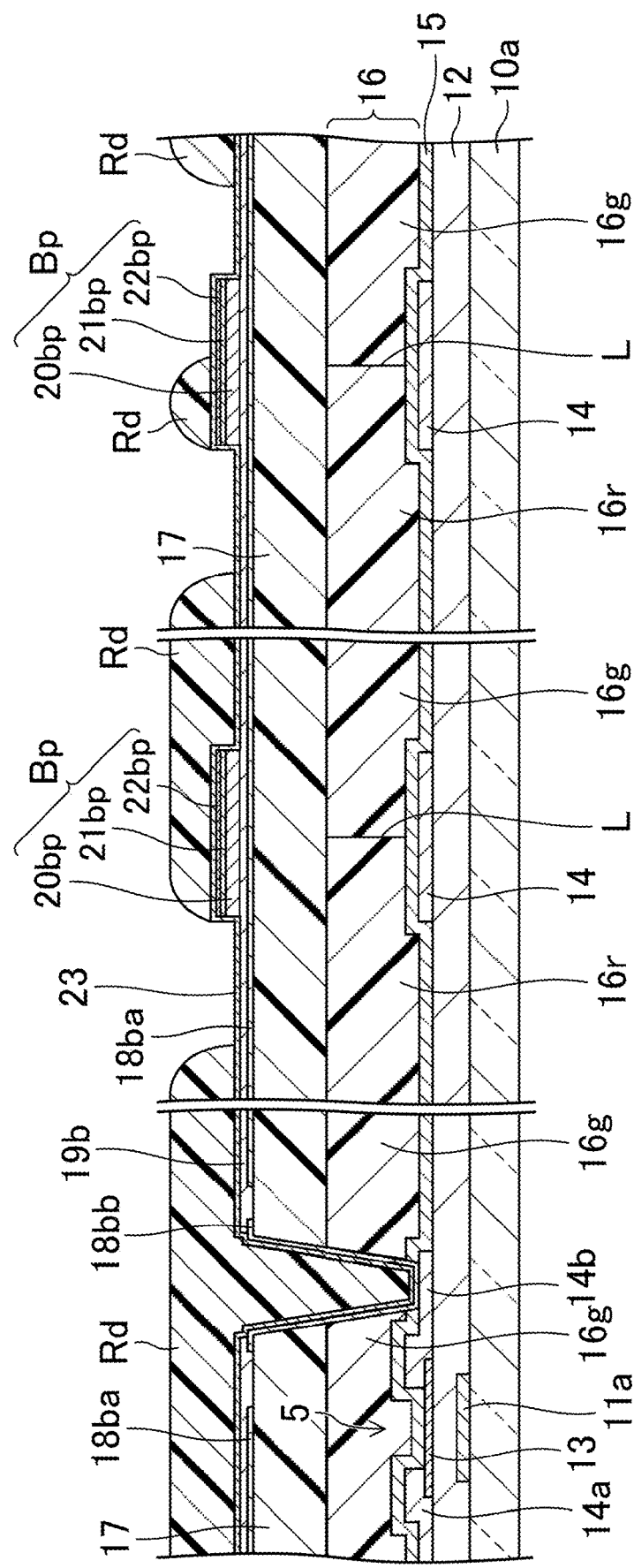
FIG. 24 is a fifth cross-sectional view subsequent to FIG. 23, illustrating a part of the manufacturing step of the active matrix substrate that is a component of the liquid crystal display device according to the second embodiment of the disclosure.

Subsequently, the second transparent conductive film 23 made of the ITO film or the IZO film with a thickness of approximately 70 nm is formed on the surface of the substrate on which the inorganic protection film 19b is formed, by, for example, sputtering, and then resists Rd are formed on the surface of the substrate by photolithography as illustrated in FIG. 24.

Figure 25:
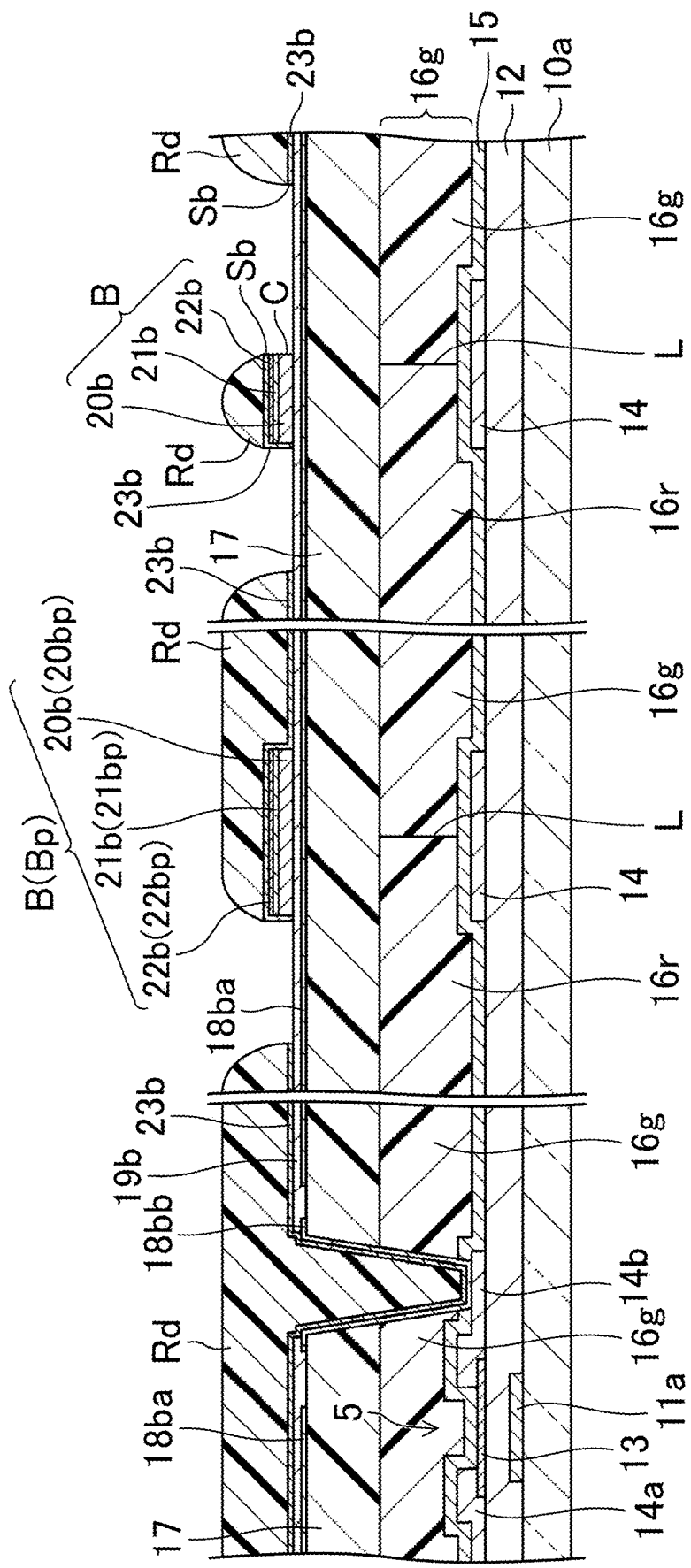
FIG. 25 is a sixth cross-sectional view subsequent to FIG. 24, illustrating a part of the manufacturing step of the active matrix substrate that is a component of the liquid crystal display device according to the second embodiment of the disclosure.

Further, the second transparent conductive film 23 and the antireflection forming layer Bp exposed from the resist Rd are subjected to the dry etching using the fluorine-based gas, thereby forming the pixel electrode 23b including the slit Sb and the antireflection layers B in which the first metal layer 20b, the intermediate layer 21b, and the second metal layer 22b are layered and including the cut-away portions C as illustrated in FIG. 25 (second transparent electrode forming step).

Subsequently, an acrylic photosensitive resin (thickness of approximately 2.5 µm) is applied to the surface of the substrate on which the pixel electrode 23b and the like is formed, by, for example, spin coating or slit coating, and the applied photosensitive resin is partially exposed and then patterned by developing, thereby forming the resin-filled layers 24.

Further, an inorganic insulating film (thickness of approximately 30 nm) such as a silicon nitride film is formed on the surface of the substrate on which the resin-filled layers 24 are formed, by, for example, plasma CVD, thereby forming the surface protection film 25.

Finally, a polyimide resin film is applied to the entire substrate on which the surface protection film 25 is formed, by, for example, a printing method, and then the resin film is subjected to baking and rubbing treatment, thereby forming the alignment film 26.

As described above, the active matrix substrate 30b can be manufactured.

Further, the active matrix substrate 30b manufactured as described above and the counter substrate 40 are bonded with a sealing member, and a liquid crystal material is sealed between the active matrix substrate 30b and the counter substrate 40 to form the liquid crystal layer 45, thereby manufacturing the liquid crystal display device of the present embodiment.

As described above, according to the active matrix substrate 30b, the liquid crystal display device including the active matrix substrate 30b, and the method of manufacturing the active matrix substrate 30b of the present embodiment, in the second transparent electrode forming step, the antireflection forming layer Bp exposed from the slit Sb of the pixel electrode 23b is removed, thereby forming the antireflection layer B provided with the cut-away portion C so as not to overlap one end portion of the slit Sb. Accordingly, since the antireflection layer B is not exposed from the slit Sb of the pixel electrodes 23b, the alignment disorder of the liquid crystal layer 45 is suppressed, and the occurrence of the image sticking and the afterimage at the end portions of the slit Sb formed in the pixel electrode 23b can be suppressed.

According to the active matrix substrate 30b, the liquid crystal display device including the active matrix substrate 30b, and the method of manufacturing the active matrix substrate 30b of the present embodiment, since one end portion of the slit Sb of the pixel electrode 23b overlaps the antireflection forming layer Bp serving as the antireflection layer B, an ultra-high definition pixel size of 1000 ppi to 1200 ppi or more for use in a head-mounted display or the like can be realized.

According to the active matrix substrate 30b, the liquid crystal display device including the active matrix substrate 30b, and the method of manufacturing the active matrix substrate 30b of the present embodiment, since the pixel electrode 23b is provided on the antireflection layer B in which the first metal layer 20b, the intermediate layer 21b, and the second metal layer 22b are layered in order, reflection of light incident from the liquid crystal layer 45 side can be effectively suppressed without adding a manufacturing step.

Other Embodiments

In each of the embodiments described above, the liquid crystal display device including the active matrix substrate in which the electrodes of the TFTs connected to the pixel electrodes serve as drain electrodes is exemplified. However, the disclosure is also applicable to a liquid crystal display device including an active matrix substrate in which the electrodes of the TFTs connected to the pixel electrodes serve as source electrodes.

INDUSTRIAL APPLICABILITY

As described above, the disclosure is useful for the liquid crystal display device of the transverse electrical field driving method including the active matrix substrate having a color filter-on-array structure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

The invention claimed is:

1. An active matrix substrate comprising:
a base substrate;
a plurality of thin film transistors, provided on the base substrate, corresponding to a plurality of subpixels;
color filters provided on the plurality of thin film transistors, respectively, and including colored layers of predetermined colors corresponding to the plurality of subpixels, respectively;
a first transparent electrode provided above the color filters;
a second transparent electrode provided on the first transparent electrode with an inorganic protection film interposed between the first transparent electrode and the second transparent electrode, the inorganic protection film being made of an inorganic insulating film, the second transparent electrode including a slit having a belt shape; and
an antireflection layer provided in a belt shape on the inorganic protection film in a boundary portion between the colored layers of different colors among the predetermined colors, the antireflection layer including a first metal layer, an intermediate layer, and a second metal layer layered in this order, wherein the antireflection layer is provided with a cut-away portion and does not overlap an end portion of the slit, the end portion of the slit is located in a region cut away by the cut-away portion of the antireflection layer, and an end face of the cut-away portion and an end face of the end portion of the slit corresponding to the cut-away portion are provided to be flush with each other.

2. The active matrix substrate according to claim 1, wherein the first transparent electrode serves as a pixel electrode provided corresponding to each of the plurality of subpixels and electrically connected to each of the plurality of thin film transistors, and the second transparent electrode serves as a common electrode provided in common to the plurality of subpixels.

3. The active matrix substrate according to claim 1, wherein the first transparent electrode serves as a common electrode provided in common to the plurality of subpixels, and the second transparent electrode serves as a pixel electrode provided corresponding to each of the plurality of subpixels and electrically connected to each of the plurality of thin film transistors.

4. The active matrix substrate according to claim 1, wherein the intermediate layer is formed of a transparent conductive film.

5. The active matrix substrate according to claim 1, wherein the intermediate layer is formed of an inorganic insulating film.

6. A liquid crystal display device comprising:

the active matrix substrate according to claim 1;

a counter substrate provided to face the active matrix substrate; and a liquid crystal layer provided between the active matrix substrate and the counter substrate.

* * * * *